(12) United States Patent
White

(10) Patent No.: US 12,302,769 B2
(45) Date of Patent: May 13, 2025

(54) CASIMIR POWER CELL

(71) Applicant: Limitless Space Institute, Houston, TX (US)

(72) Inventor: Harold White, Houston, TX (US)

(73) Assignee: Limitless Space Institute, Houston, TX (US)

( * ) Notice: Subject to any disclaimer, the term of this patent is extended or adjusted under 35 U.S.C. 154(b) by 195 days.

(21) Appl. No.: 18/331,486

(22) Filed: Jun. 8, 2023

(65) Prior Publication Data

US 2024/0415034 A1    Dec. 12, 2024

(51) Int. Cl.
*H10N 99/00*    (2023.01)

(52) U.S. Cl.
CPC .................................. *H10N 99/05* (2023.02)

(58) Field of Classification Search
CPC .............................. H10N 99/05; Y02E 60/10
USPC ........................................................ 361/233
See application file for complete search history.

(56) References Cited

U.S. PATENT DOCUMENTS

| | | | |
|---|---|---|---|
| 11,133,758 B2 | 9/2021 | Moddel | |
| 11,463,026 B2 | 10/2022 | Moddel | |
| 2012/0076162 A1* | 3/2012 | Girlando | H02S 99/00 372/36 |
| 2018/0059704 A1* | 3/2018 | Villalobos | H02J 7/345 |
| 2020/0321514 A1* | 10/2020 | Sadr | H10N 30/2042 |
| 2020/0358375 A1* | 11/2020 | Moddel | H02N 11/008 |
| 2021/0135600 A1 | 5/2021 | Thibado et al. | |

OTHER PUBLICATIONS

White, H. et al.; "A discussion on a dynamic vacuum model: Derivation of Helmholtz equation from Schrödinger equation"; Elsevier, Physics Open, vol. 1, Dec. 2019 (8 pages).
White, H. et al.; "Worldline numerics applied to custom Casimir geometry generates unanticipated intersection with Alcubierre warp metric"; The European Physical Journal C, vol. 81, No. 677, Jul. 31, 2021 (10 pages).
White, H., et al.; "Dynamic Vacuum Model and Casimir Cavity Experiments" Journal of the British Interplanetary Society, General Interstellar Issue, vol. 73, No. 7, Jul. 2020, pp. 268-272 (44 pages).
Moddel, G. et al.; "Optical-Cavity-Induced Current"; symmetry, vol. 13, No. 517, Jan. 7, 2021 (16 pages).
Moddel, G. et al.; "Casimir-cavity-induced conductance changes"; Physical Review Research, vol. 3, Issue 2, Apr. 2021, pp. L022007-1-L022007-7 (7 pages).

\* cited by examiner

*Primary Examiner* — Kevin J Comber
(74) *Attorney, Agent, or Firm* — Osha Bergman Watanabe & Burton LLP

(57) ABSTRACT

A battery includes a Casimir-effect powered cell (Casimir cell). The Casimir cell includes a first conductive wall; a second conductive wall that faces the first conductive wall; and a conductive antenna disposed in a cavity gap that is a space between the first conductive wall and the second conductive wall. The conductive antenna faces the first conductive wall and the second conductive wall. The first conductive wall and the second conductive wall produce a same first voltage potential. The conductive antenna produces a second voltage potential that is different from the first voltage potential. A voltage that is the difference between the first voltage potential and the second voltage potential is generated by Casimir phenomenon based on arrangement of the conductive antenna between the first conductive wall and the second conductive wall.

20 Claims, 14 Drawing Sheets

CASIMIR POWER CELL

BACKGROUND

If one were to understand the natural world as a Venn diagram, the diagram would consist of two circles touching at a tangent point. In the two-circle diagram, one circle would be General Relativity (GR) and the other circle would be Quantum Field Theory (QFT). These two circles represent the two standard models of physics that can explain the natural world. GR is the study of the macroscopic world at the cosmological scale and helps to understand how stars and galaxies move. QFT, on the other hand, is the study of the microscopic world; how atoms and electrons behave; how light interacts with matter; a scale where matter exhibits both properties of particles and waves. The fact that these two circles touch at a tangent point is an indication that QFT has been made relativistic by means of the Dirac Equation, whereby Special Relativity (SR) is incorporated. This current state-of-affairs of the Venn diagram suggests that there is a larger circle that circumscribes the existing circles whereby a more complete and generalized understanding of the natural world is represented.

The concept of a generalized and comprehensive understanding of nature is often referred to as Grand Unified Theory (GUT). However, in smaller steps, a model developed in the literature called the dynamic vacuum model is a possible illustration of expanding the Venn diagram. This enhanced Venn diagram would now consist of three circles like a two-dimensional projection of Borromean rings, with the additional qualifier that two of the three rings only touch at a tangent point. In this scenario, the dynamic vacuum model circle partly intersects both the GR and QFT circles, but also encircles a region not enclosed by either of the GR and QFT circles. With this situation, the dynamic vacuum model can explain physical properties that neither GR nor QFT does.

One concept that the dynamic vacuum model can explain is harvesting energy from empty space in microscopic scale. This is different from the case of solar cells where photons excite electron-hole pairs and generate electricity. A device that can harvest energy from empty space into practical electric power would be of high importance for replacing fossil fuels and for situations where traditional renewable energy (e.g., solar, wind, geothermal, etc.) cannot be used.

SUMMARY

This summary is provided to introduce a selection of concepts that are further described below in the detailed description. This summary is not intended to identify key or essential features of the claimed subject matter, nor it is intended to be used as an aid in limiting the scope of the claimed subject matter.

This disclosure presents, in accordance with one or more embodiments, a battery that includes a Casimir-effect powered cell (Casimir cell). The Casimir cell includes: a first conductive wall; a second conductive wall that faces the first conductive wall; and a conductive antenna disposed in a cavity gap that is a space between the first conductive wall and the second conductive wall. The conductive antenna faces the first conductive wall and the second conductive wall. The first conductive wall and the second conductive wall produce a same first voltage potential. The conductive antenna produces a second voltage potential that is different from the first voltage potential. A voltage that is the difference between the first voltage potential and the second voltage potential is generated by Casimir phenomenon based on arrangement of the conductive antenna between the first conductive wall and second conductive wall.

In another aspect, this disclosure also presents, in accordance with one or more embodiments, a method for making a Casimir cell. The method includes: etching a substrate to create a first conductive wall on the substrate; etching the substrate to create a second conductive wall on the substrate such that the second conductive wall faces the first conductive wall; and etching the substrate to create a conductive antenna disposed in a cavity gap that is a space between the first conductive wall and the second conductive wall. The conductive antenna faces the first conductive wall and the second conductive wall. The first conductive wall and the second conductive wall are etched to be electrically connected and have a same first voltage potential. The conductive antenna is etched to have a second voltage potential that is different from the first voltage potential.

Other aspects and advantages of the invention will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and have been solely selected for ease of recognition in the drawing.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the disclosure, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements. In addition, throughout the disclosure, "or" is interpreted as "and/or," unless stated otherwise.

Physical Embodiment(s)

One or more embodiments disclosed herein describe a Casimir-effect power cell (hereinafter, will be referred to as Casimir cell) and a battery that includes one or more of the Casimir cells. In one or more embodiments, even one Casimir cell or one Casimir cell array may be referred to as a battery. The Casimir cell is a power cell that generates electrical power by using the Casimir phenomenon that will be described further below, in accordance with one or more embodiments disclosed herein. In this disclosure, the Casimir cell is also referred to as "Casimir cavity."

Figure 1:
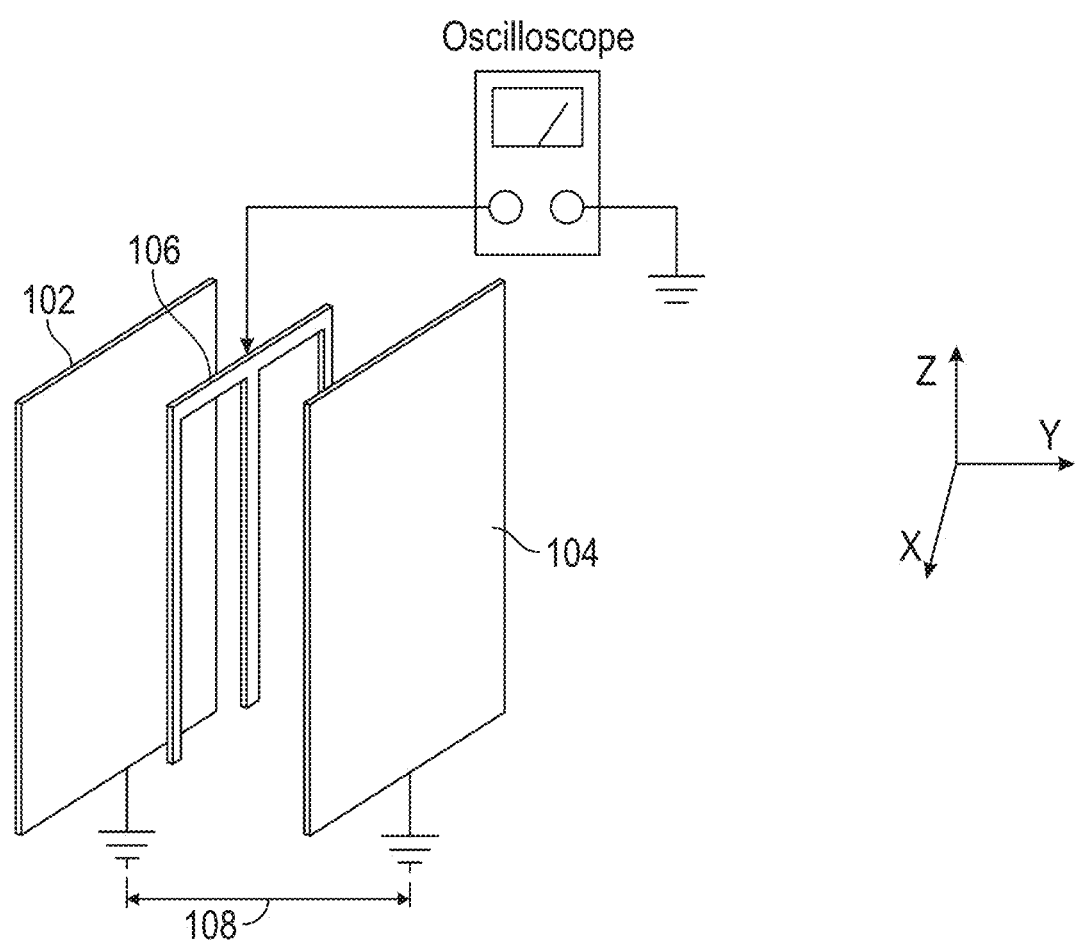
FIG. 1 shows a Casimir-effect power cell (Casimir cell), in accordance with one or more embodiments disclosed herein.

FIG. 1 schematically shows a Casimir cell that includes a first conductive wall (102), a second conductive wall (104) that faces the first conductive wall (102), and a conductive antenna (106) disposed in a cavity gap (108) that is the space between the first conductive wall (102) and the second conductive wall (104). The conductive antenna (106) faces the first conductive wall (102) and the second conductive wall (104). In one or more embodiments, a first distance between the conductive antenna (106) and the first conductive wall (102) is the same as a second distance between the conductive antenna (106) and the second conductive wall (104). In this disclosure, the first conductive wall and second conductive wall are also referred to as the conductive walls. In addition, in this disclosure the first and second conductive walls are also referred to as "cavity walls."

The first conductive wall (102) and the second conductive wall (104) have a same first voltage potential. As shown in FIG. 1, the first conductive wall (102) and the second conductive wall (104) are both grounded, and thus can be considered as that they have the reference voltage potential of zero. The conductive antenna (106) has a second voltage potential that is different from the first voltage potential. The second voltage potential is produced due to Casimir phenomenon applied to the first conductive wall (102), the second conductive wall (104), and the conductive antenna (106). Accordingly, a voltage that is the difference between the first voltage potential and the second voltage potential and a corresponding electrical current (hereinafter, will be referred to as "current") will be generated by Casimir phenomenon and can be measured using an oscilloscope. In other words, the Casimir cell generates electric power. As shown in FIG. 1, a terminal of the oscilloscope is connected to the conductive antenna (106) and the other terminal of the oscilloscope is grounded (i.e., connected to the grounded first conductive wall (102) and second conductive wall (104)). Further below in the following sections, the underlying physics involved in the generation of electric power is described.

The conductive antenna may include one or more antenna elements to generate the second voltage potential resulting from the Casimir phenomenon. For example, the conductive antenna (106) shown in FIG. 1 includes three antenna elements in the form of pillars and disposed parallel with respect to one another. From a cross-sectional view of the Casimir cell perpendicular to the length of the antenna elements (i.e., the view along the Z axis), one or more of the antenna elements may have a round, rectangular, or prismatic shape.

In one or more embodiments, the first conductive wall, second conductive wall, and conductive antenna may be made of the same material. Alternatively, the first conductive wall, second conductive wall, and conductive antenna may be made of different materials. The material(s) may be, but are not limited to, gold (Au), silver (Ag), platinum (Pt), aluminum (Al), copper (Cu), palladium (Pd), iridium (Ir), titanium nitride (TiN), molybdenum (Mo), silicon (Si), or graphene. In one or more embodiments, n-doped and p-doped semiconductors may be used for the first conductive wall, second conductive wall, and conductive antenna. For example, the first conductive wall and second conductive wall may be a p-doped semiconductor material and the conductive antenna may be an n-doped semiconductor, or vice versa. This arrangement facilitates formation of a depletion region between two adjacent Casimir cells where the conductive walls of one Casimir cell are connected to the conductive antenna of an adjacent Casimir cell. This material approach may be utilized to increase the realizable voltage magnitude for a given Casimir cell design. In some embodiments, one or two of the first conductive wall, second conductive wall, and conductive antenna may be made of metal and the rest of these features may be made of a conductive semiconductor (e.g., a doped semiconductor).

In one or more embodiments, the intervening spaces between the conductive antenna and the conductive walls may be vacuum, air, or filled with a gas dielectric or a liquid dielectric. Alternatively, the intervening spaces may be filled with a solid dielectric that may be, but is not limited to, silicon dioxide ($SiO_2$), aluminum oxide ($Al_2O_3$), tantalum pentoxide ($Ta_2O_5$), cerium oxide ($CeO_2$), hafnium oxide ($HfO_2$), Niobium pentoxide ($Nb_2O_5$), Niobium dioxide ($NbO_2$), titanium dioxide ($TiO_2$), titanium oxide (TiO or $Ti_3O_5$), Yttrium oxide ($Y_2O_3$), zirconium dioxide ($ZrO_2$), or zirconium oxide (ZrO). Using a solid dielectric with a high breakdown voltage, such as $HfO_2$, may improve the Casimir cell's ability of generating electricity, by reducing tunneling current or preventing discharge between the conductive antenna and the conductive walls. As it will be explained below, when the cavity gap becomes smaller, the voltage generated by the Casimir cell becomes larger.

In one or more embodiments, the cavity gap (for example cavity gap (108)) may be 10 micrometers or smaller to generate practical electricity by the Casimir cell. In one or more embodiments, the cavity gap is 90 nanometers (nm). Further, in one or more embodiments, the cavity gap may be 10 nm. In one or more embodiments, the cavity gap may be even smaller, for example 3 nm or 1 nm. The manufacturing offset from the targeted cavity gap of 90 nm or lower depends on current nanofabrication technology and equipment limits/errors. While decreasing the cavity gap to lower than these numbers (e.g., sub-nanometer region) may improve the voltage, it may be limited by manufacturing capabilities and tunneling current.

Figure 2:
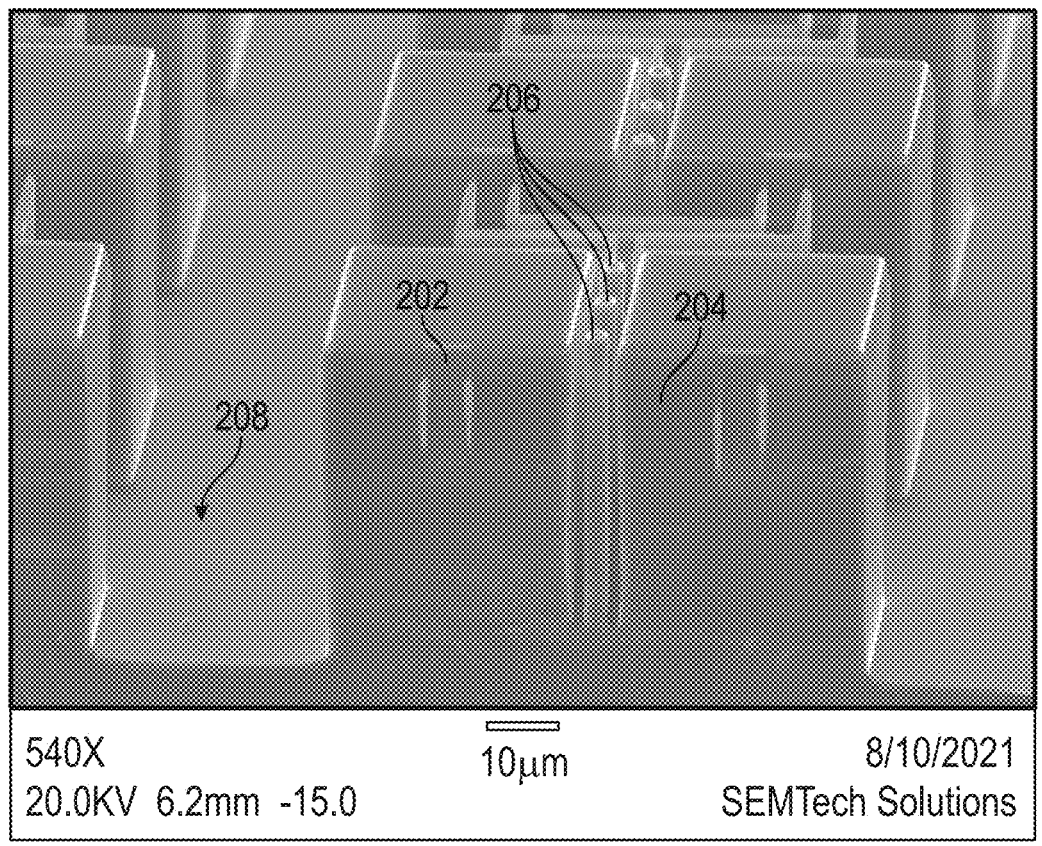
FIG. 2 shows a scanning electron microscope image of a vertical Casimir cell, in accordance with one or more embodiments disclosed herein.
Figure 2:
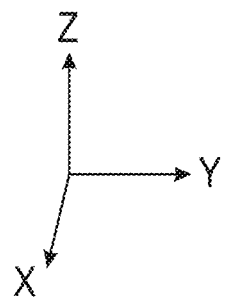

FIG. 2 shows a scanning electron microscope (SEM) image of an array of vertical Casimir cells, in accordance with one or more embodiments disclosed herein. Each Casimir cell includes a first conductive wall (202), a second conductive wall (204) that faces the first conductive wall (202), and a conductive antenna (206) disposed in the cavity gap between the first conductive wall (202) and the second conductive wall (204). The conductive antenna (206) is disposed at the mid-plane between the first conductive wall (202) and the second conductive wall (204), for optimal voltage generation. In one or more embodiments, the array of the Casimir cells is grouped into a plurality of groups of Casimir cells. Each group includes a plurality of Casimir cells that are connected to one another in parallel such that all of the conductive walls (202, 204) of the group are connected to one another and produce a same first voltage potential, for example the electrical ground, and all of the conductive antennas (206) of the group are connected to one another and produce a second voltage potential that is different from the first voltage potential. This way the current generated by the array will be the current generated by the group that is the sum of the currents generated by all of the Casimir cells in the group. The plurality of groups are connected in series to one another. This way, the voltage generated array will be the sum of the voltages generated by all of the groups. Accordingly, by determining the number of the Casimir cells connected in parallel in each group and by determining the number of the groups that are connected in series, the current and voltage of the array can be determined, respectively.

The conductive antenna (206) includes a plurality of pillars. In one or more embodiments, the diameter of each pillar is half of the size of the gap between the first conductive wall (202) and second conductive wall (204). Each of the first conductive wall (202) and second conductive wall (204) are 40 micrometers by 40 micrometers in length and height and the cavity gap between the conductive walls (202, 204) is 10 micrometers. In FIG. 2, the length of the conductive walls (202, 204) is along the X axis, the height of the conductive walls (202, 204) is along the Z axis, and width of the conductive walls (202, 204) as well as the cavity gap are along the Y axis. The pillars inside the cavity gap are 5 micrometers in diameter and 40 micrometers tall, spanning the entire height of the cavity gap. The Casimir cell was fabricated using deep reactive ion etching equipment commonly used in the semiconductor fabrication industry. While these are the dimensions of the fabricated Casimir cell, the invention is not limited to these dimensions.

In one or more embodiments, the magnitude of the voltage increases as the distance between the conductive wall and the pillars decreases. An analytic treatment of the Casimir cavity suggests that the voltage magnitude can increase proportionally to, where $1/d^{2^t}$ is the distance between the first and second conductive walls, which is the overall width of the Casimir cavity. For example, in FIG. 1 "d" is the width of the cavity gap (108).

As shown in FIG. 2, the vertical Casimir cell stands orthogonal with respect to the substrate (208). To achieve this arrangement, the conductive walls (202, 204) and the conductive antenna (206) are etched onto a conductive semiconductor wafer such that the conductive walls (202, 204) and conductive antenna (206) form from the conductive semiconductor that is on an insulator layer. To this end, for example, a semiconductor on insulator wafer may be used. The orientation of the conductive walls and conductive antenna to the substrate may be envisioned as books arrayed vertically on a bookshelf in a library where the spines of the books are aligned in an upward direction.

From a circuit element perspective, each individual Casimir cell is manufactured such that its conductive walls are electrically connected while also being electrically isolated from the conductive antenna. The voltage magnitude of a given Casimir cell depends on the cavity gap where a smaller cavity gap will increase the voltage magnitude. The diameter or dimensions of the antenna structure can also affect the voltage magnitude, and numerical analysis can be used to determine the optimal ratio of antenna size with respect to the cavity gap. The tunneling current magnitude of a given Casimir cell depends on the cavity gap and increases as the dimension of the cavity gap decreases. The tunneling current magnitude also depends on the cross-sectional area of the conductive walls and conductive antenna, and increases with larger areas (i.e., longer length or height).

In one or more embodiments, a larger surface area for the first and second conductive walls (e.g., longer length or height of the conductive walls in FIG. 2) generates a larger current in terms of power generation for an individual Casimir cell, considering everything else would be equal. The manufacturing challenge for etching a vertical Casimir cell, an example of which is shown in FIG. 2, is the aspect ratio of the vertical etch depth versus the cavity gap.

In one or more embodiments, an Oxford Instruments Cypher S Atomic Force Microscope (AFM) was used to measure the electrostatic polarization field on the Casimir cell shown in FIG. 2 with the conductive wall surface area of 40 micrometers by 40 micrometers and the cavity gap of 10 micrometers. The Kelvin Probe Force Microscopy (KPFM) mode of the AFM was used to measure the electrostatic fields manifested on the different elements of the Casimir cell. The KPFM technique uses the AFM equipped with a conducting AFM tip. Each line of a KPFM scan of a test article includes an AC-tap mode run to establish a topographical map of the device under test. The AFM uses the AC-tap mode to develop an internal map of the underlying mechanical location of the surface being scanned. On the return of the scan line, the AFM uses the topographical map to fly the AFM tip at an offset to the test surface to avoid contact with the test surface just previously tapped—this is called nap mode. During this return scan, the AFM tip is driven with an AC signal while the amplitude of the AFM tip oscillation is monitored. This oscillation magnitude is fed into a control algorithm that changes a DC offset to the AC voltage signal such that the control algorithm seeks to minimize the magnitude of the oscillation. This DC voltage is equivalent to the voltage potential that exists on the structure exactly beneath the AFM tip. This is how the AFM system was able to construct a two-dimensional mapping of the electrostatic charges that exist on the surface of the Casimir cell.

Figure 3:
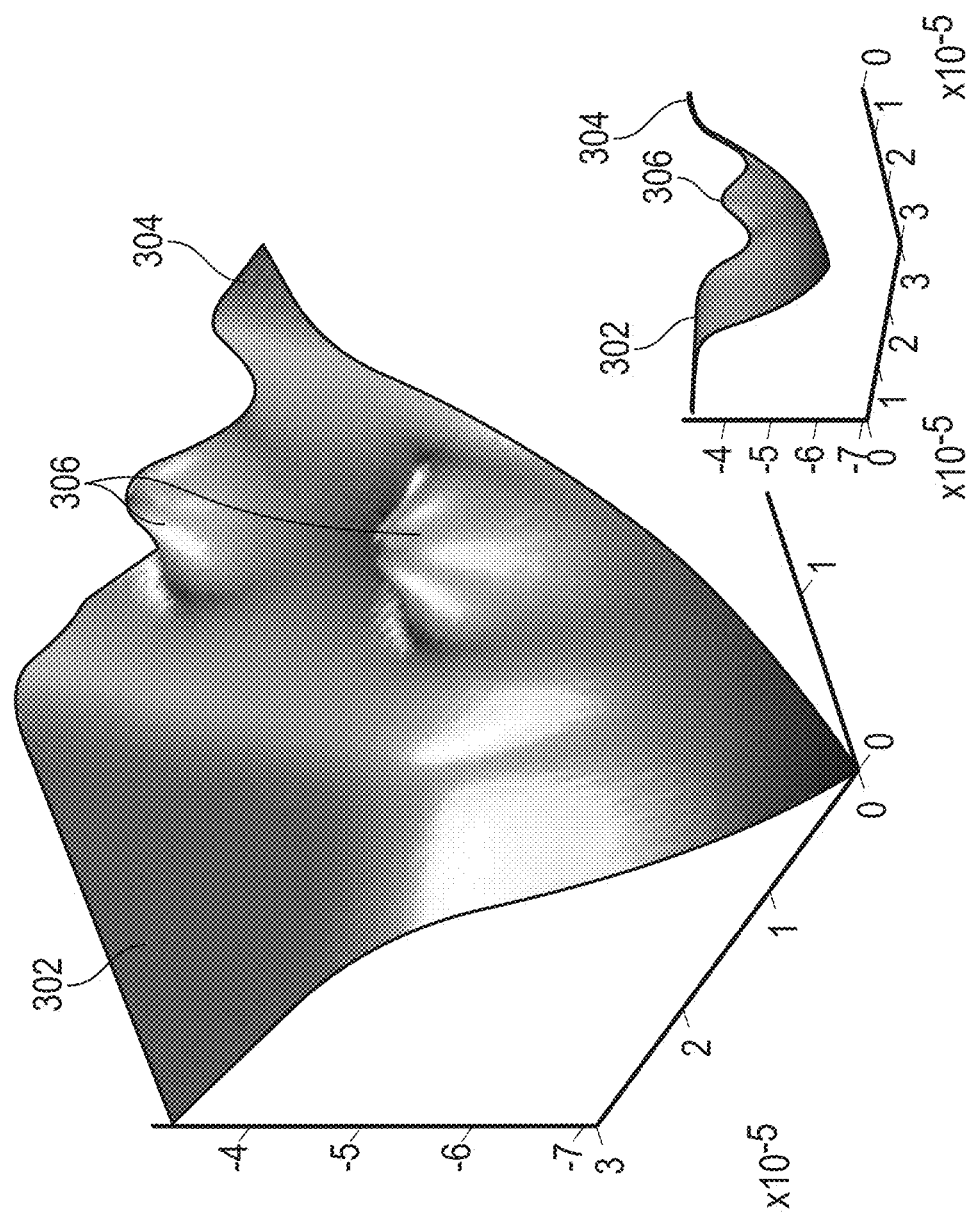
FIG. 3 shows a voltage potential map of a Casimir cell, in accordance with one or more embodiments disclosed herein.

FIG. 3 shows an isometric view and elevation of the averaged KPFM data set of a 30 micrometer by 30 micrometer footprint of the Casimir cell identical to those depicted in the SEM image of FIG. 2. In this surface plot, the height of the data is not representative of the physical height of the scanned structure, rather it represents the voltage potential of the scanned test surface. The isometric view clearly shows the conductive walls (302, 304) and the pillars of the conductive antenna (306) in the cavity gap, and the elevation view in the inset of FIG. 3 illustrates that the voltage potential of the pillars is clearly less that the voltage potential of the conductive walls. In other words, the pillars are at a negative voltage potential with respect to the surrounding conductive walls.

In one or more embodiments, the Casimir cell may be horizontally aligned relative to a supporting non-conducting substrate. This arrangement can be considered analogous to printer papers stacked in a printer paper feed tray. This horizontal arrangement may facilitate making the cavity gap between the first conductive wall and the second conductive wall ultra small, for example in nanometers regime or less, compared to the vertical Casimir cell described above with reference to FIG. 2.

Figure 4A:
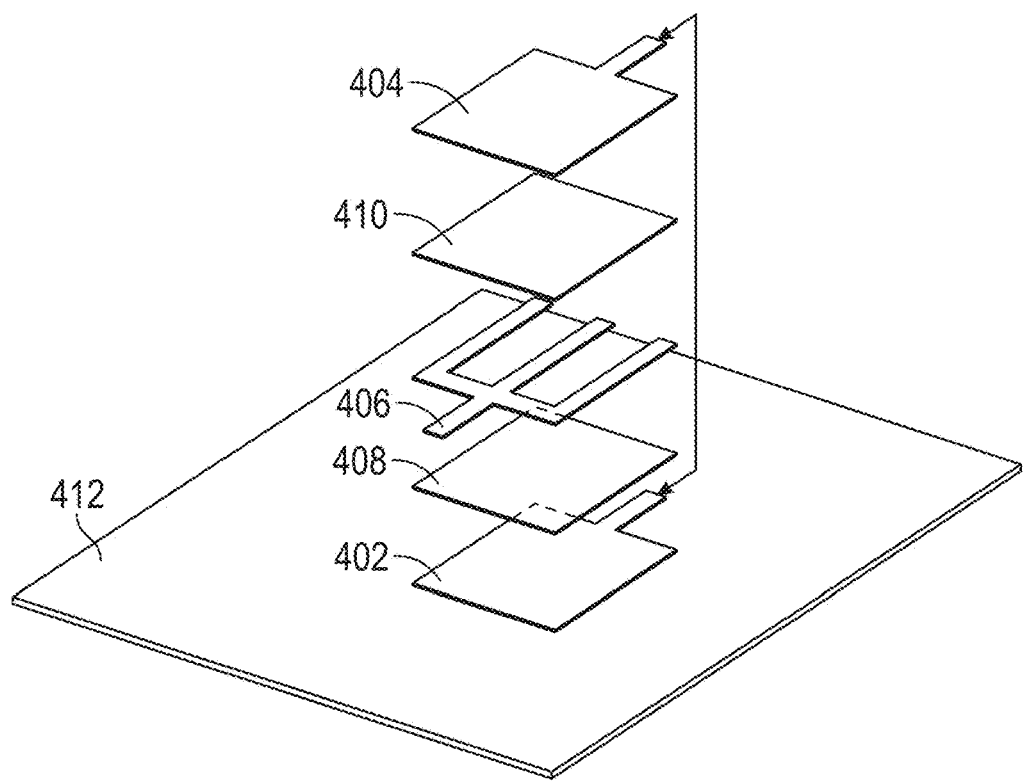
FIG. 4A shows a horizontal Casimir cell, in accordance with one or more embodiments disclosed herein.

FIG. 4A shows an example of the horizontal arrangement, in accordance with one or more embodiments. Specifically, in the horizontal arrangement a first conductive wall (402) is disposed horizontally on a substrate (412), a first dielectric (408) is disposed horizontally on the first conductive wall (402), a conductive antenna (406) is disposed horizontally on the first dielectric (408), a second dielectric (410) is disposed horizontally on the conductive antenna (406), and a second conductive wall (404) is disposed horizontally on the second dielectric (410). Accordingly, the conductive antenna (406) is encapsulated in between the first conductive wall (402) and second conductive wall (404). The conductive antenna (406) is electrically isolated from the first conductive wall (402) and second conductive wall (404) via the first dielectric (408) and second dielectric (410) and have a second voltage potential while the first conductive wall (402) and second conductive wall (404) are electrically connected and have a same first voltage potential that is different from the second voltage potential.

In one or more embodiments, the horizontal arrangement may enable Casimir cells with large conductive wall areas, which result in more current capability, and smaller cavity gaps, which result in higher voltage capability, than those may be achieved by the vertical Casimir cells. In addition, the horizontal arrangement may be more compatible with manufacturing capabilities used across the Integrated Circuit (IC) industry than the vertical Casimir cells.

Figure 4B:
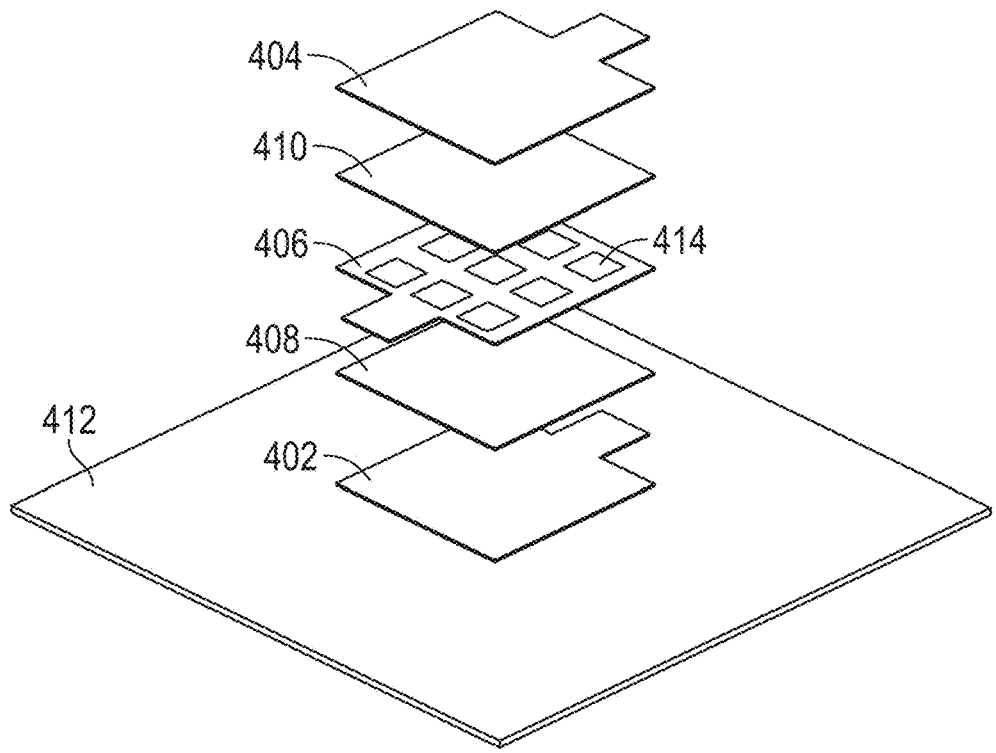
FIG. 4B shows a horizontal Casimir cell, in accordance with one or more embodiments disclosed herein.

According to one or more embodiments, in the horizontal arrangement the conductive antenna may be a grid (e.g., a waffle grid) in lieu of parallel pillars. This may enable a larger surface area for the conductive antenna and thus a larger current generated by the Casimir cell, while maintaining the balance of preserving the optical transparency of the encapsulating Casimir cell. FIG. 4B shows an example of a horizontal Casimir cell on a substrate (412) where the conductive antenna (406) is a grid. The grid includes holes (414) where a dielectric spacer (e.g., first dielectric (408) and second dielectric (410)) may be disposed. Similar to the example described with reference to FIG. 4A, the Casimir cell of FIG. 4B includes a first dielectric (408) and a second dielectric (410) to provide a space between the conductive antenna (406) and each of the first and second conductive walls (402, 404), respectively.

In one or more embodiments, the conductive antenna may be a continuous flat plane and its dielectric/optical properties are such that the conductive antenna is semi-transparent to a large fraction of the electromagnetic/optical frequencies that may manifest in a given Casimir cell design.

In one or more embodiments, if the antenna structure would be a non-transparent structure with no perforations, such as a continuous metal plate, then the antenna structure will create two adjacent Casimir cavities in lieu of a single Casimir cavity with a discontinuous structure at the midplane placed to establish the polarization field.

Figure 5:
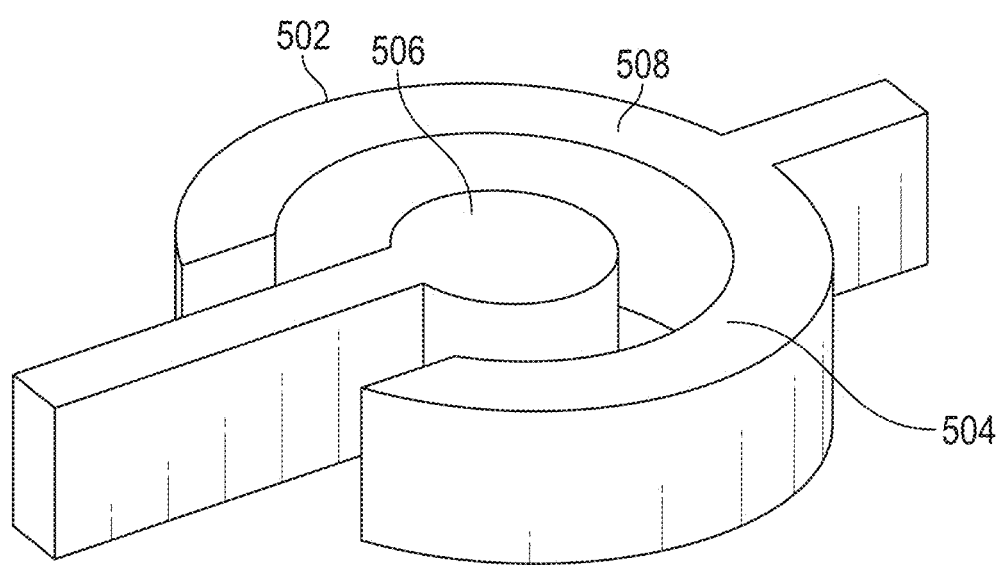
FIG. 5 shows a c-shape Casimir cell, in accordance with one or more embodiments disclosed herein.

In one or more embodiments, the Casimir cell may have a nested c-shape as shown in FIG. 5. Specifically, in the Casimir cell of FIG. 5, the conductive antenna (506) is the inner cylinder that is a singular pillar. The outer nested and concentric wall is the conductive wall (508) and can be considered to include a first conductive wall (502) and a second conductive wall (504) that are on opposite sides of the conductive antenna (506).

Figure 6:
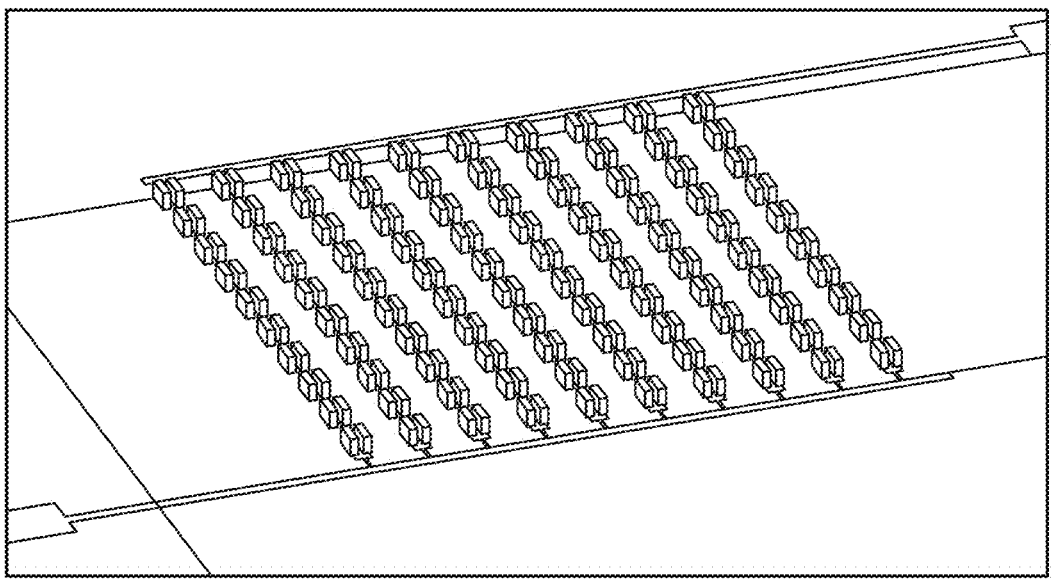
FIG. 6 shows an array of Casimir cells connected in series and in parallel, in accordance with one or more embodiments disclosed herein.

In one or more embodiments, a plurality of Casimir cells may be arranged in circuit topologies such that they are arrayed in series to increase effective voltage magnitude and arrayed in parallel to increase effective current. These circuit topologies may be arranged with a blend of parallel and series circuit element approaches to tailor the integrated system voltage magnitude and current capability for the intended application. FIG. 6 shows an array of Casimir cells that includes 100 vertical Casimir cells on one substrate. In the arrangement of the array of Casimir cells shown in FIG. 6, the plurality of Casimir cells are grouped into 10 groups that are connected to one another in parallel. The in parallel connection of the groups multiplies the current by the number of groups. Within each group, 10 Casimir cells are connected in series, which multiplies the voltage by the number of Casimir cells within the group. Accordingly, the current of the array of Casimir cells shown in FIG. 6 would be 10 times (i.e., the number of the groups connected in parallel) of the current of an individual Casimir cell among the plurality of Casimir cells and the voltage of the array of Casimir cells would be 10 times (i.e., the number of Casimir cells connected in series within one group) of the voltage of the individual Casimir cell. The number of groups of Casimir cells and the number of Casimir cells within each group is not limited to the numbers disclosed in this example and can vary depending on a specific design or function of the array of Casimir cells.

Alternatively, in one or more embodiments an array of Casimir cells may be grouped into a plurality of groups such that the groups are connected in series with one another, and Casimir cells of each group are connected in parallel to one another. This way, the current of the array of Casimir cells would be proportional to the number of the Casimir cells within each group and the voltage of the array of Casimir cells would be proportional to the number of groups.

Figure 7:
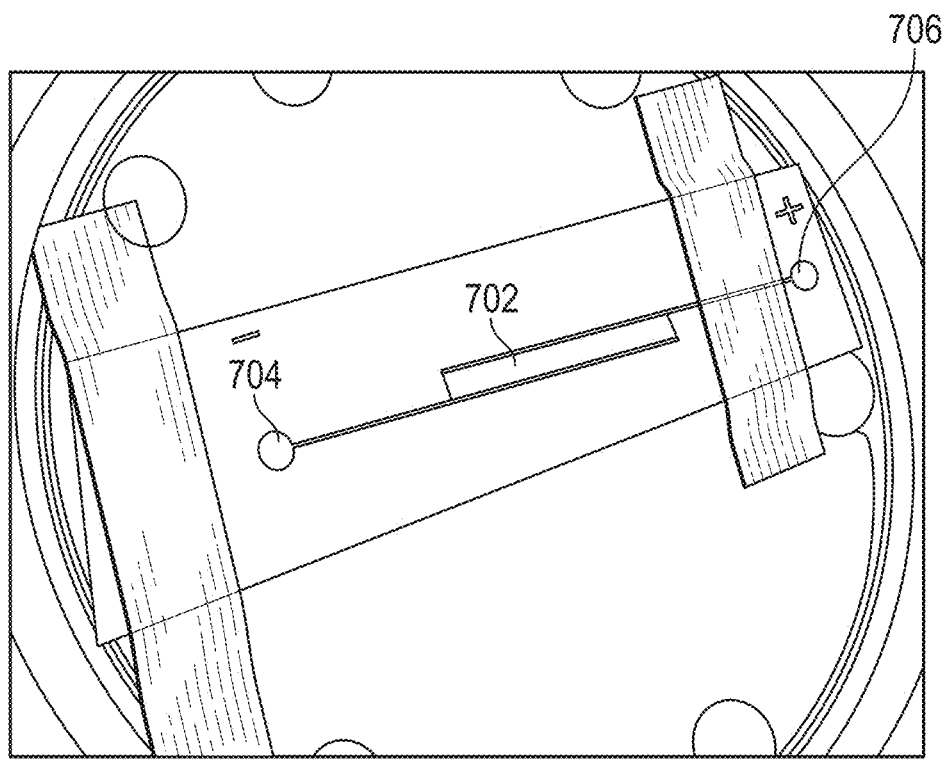
FIG. 7 shows an array of Casimir cells connected in series and in parallel, in accordance with one or more embodiments disclosed herein.
Figure 8A:
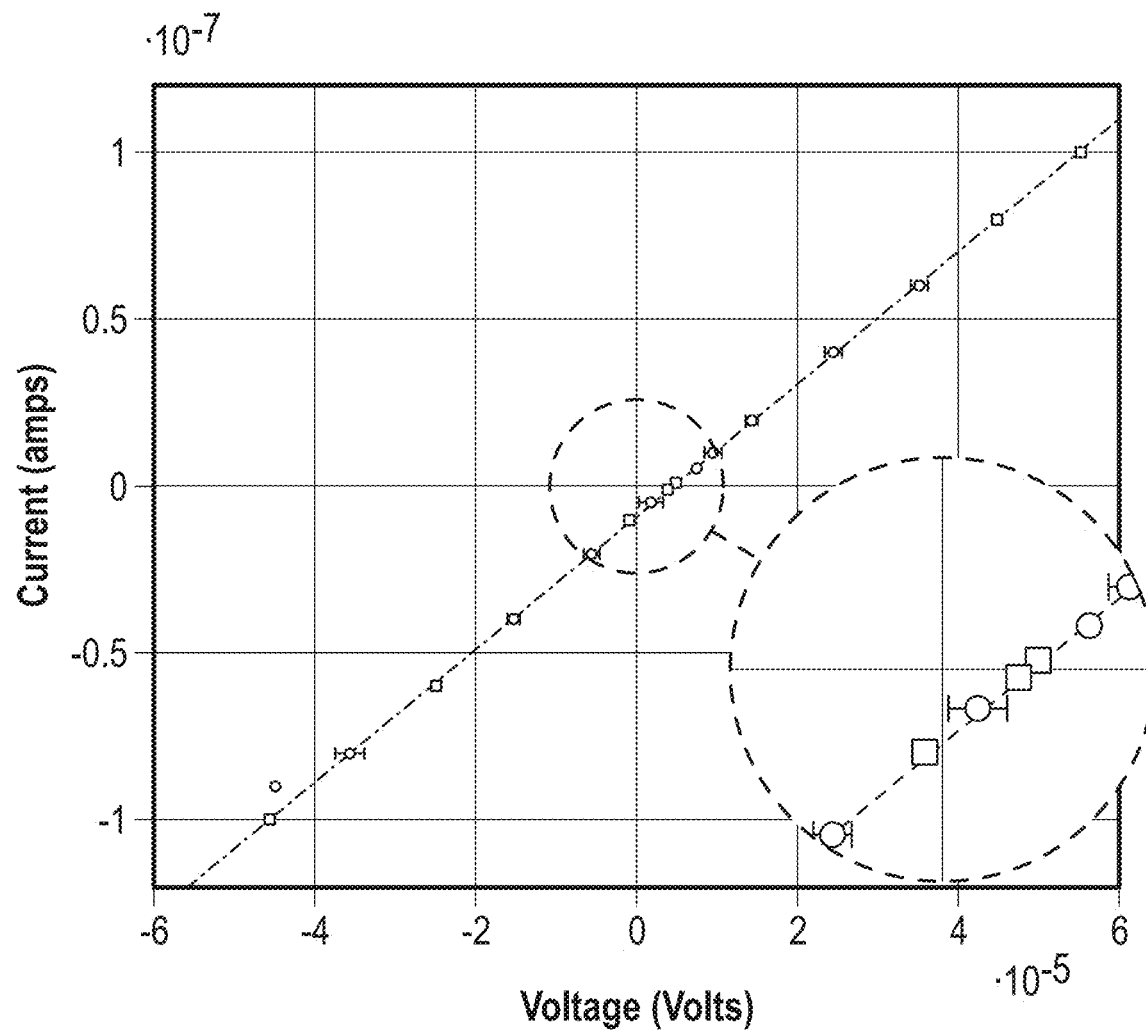
FIG. 8A shows a voltage-current diagram of the array of Casimir cells shown in FIG. 7, using a four-point probe, in accordance with one or more embodiments disclosed herein.

FIG. 7 shows a prototype array of Casimir cells (702), in accordance with one or more embodiments. The prototype array of Casimir cells (702) includes 100 groups of Casimir cells and the groups are connected in parallel to one another. Each group includes 10 Casimir cells that are connected in series to one another. The prototype array of Casimir cells (702) was used in four-point probe testing to determine its voltage-current (V-I) performance. FIG. 8A is a plot of V-I data collected for the prototype array of Casimir cells (702) shown in FIG. 7. The data is plotted with 5-σ error bars. Error bars of the current are not discernible whereas error bars of the voltage are occasionally visible. The inset magnified view of the plot shows that as the V-I line crosses the voltage and current axes, there is a non-zero short-circuit current (ISC) and a non-zero open-circuit voltage (VOC). The ISC and VOC are characteristics of an electric power generator that also can be seen in solar cells.

Figure 8B:
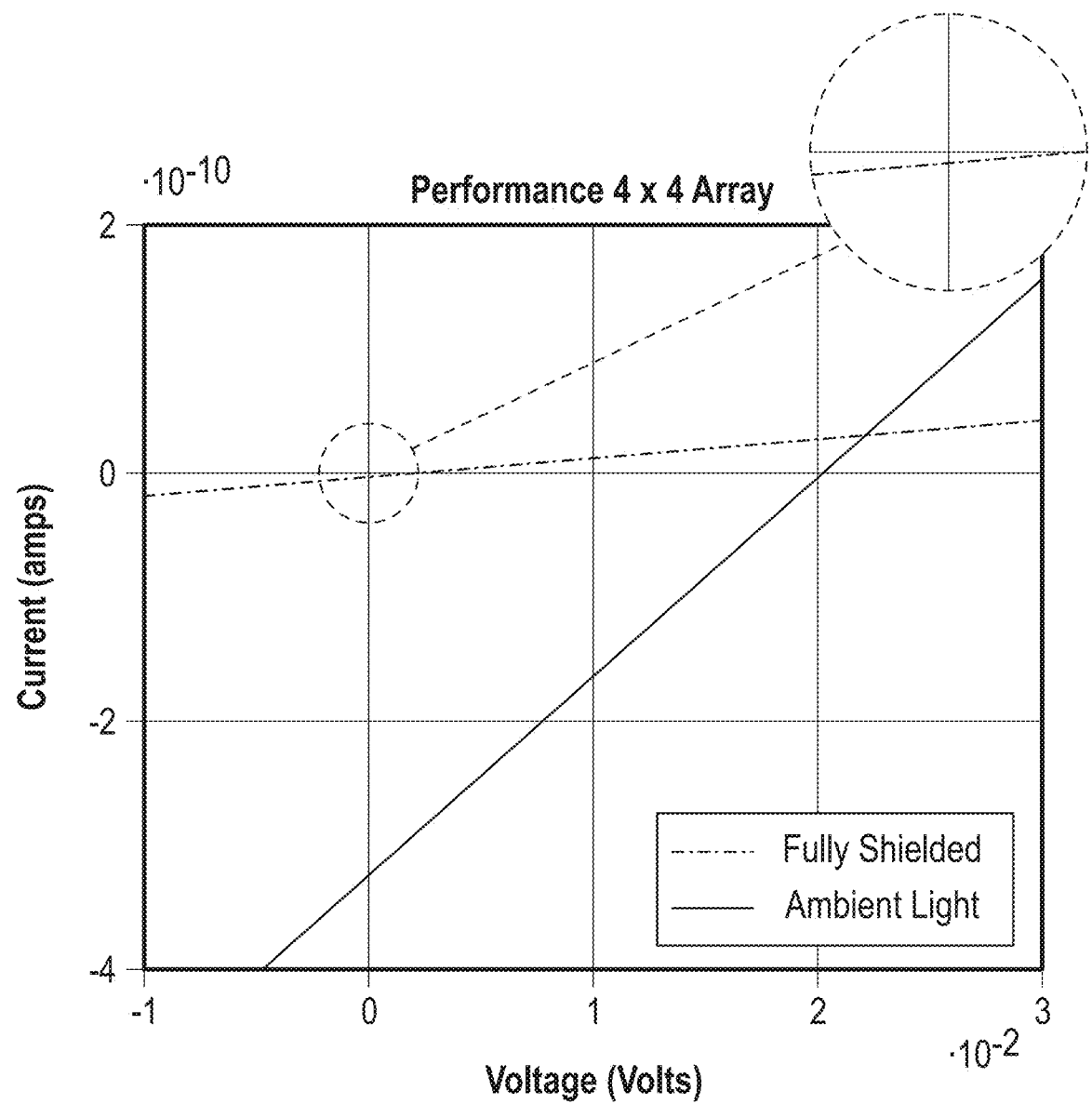
FIG. 8B shows a voltage-current diagram of an array of Casimir cells, in accordance with one or more embodiments disclosed herein.

In accordance with one or more embodiments disclosed herein, light exposure to the Casimir cell can enhance the generated power by the Casimir cell. For example, FIG. 8B is a plot of V-I data collected for a staggered Casimir cell array of 4×4 Casimir cells for when the array is fully shielded from ambient light and for when the array is exposed to ambient light. Each of the Casimir cells in the Casimir cell array is a horizontal Casimir cell, similar to the horizontal Casimir cell described above with reference to FIG. 4A. The larger circle in FIG. 8B shows a close-up view of the smaller circle on the V-I plot. The conductive walls and conductive antenna for the tested Casimir cell array are made of aluminum, in this example.

As shown in FIG. 8B, the Casimir cell array generates more ISC and VPC when the Casimir cell array is exposed to ambient light compared to when the Casimir cell array is fully shielded from ambient light. In other words, the voltage that is the difference between the voltage potential of the conductive walls and the voltage potential of the conductive antenna is also generated by the Casimir cells' exposure to light, based on the arrangement of the conductive antenna between the conductive walls. According to this data, the power generation is increased by about three orders of magnitude for when the Casimir cell array is exposed to ambient light compared to when the Casimir cell array is fully shielded from ambient light. In addition, the Casimir cell array has higher conductivity (lower electrical resistance), by about one order of magnitude, when the Casimir cell array is exposed to ambient light compared to when the Casimir cell array is fully shielded from ambient light.

In view of the above, in accordance with one or more embodiments, in addition to generating electric power via the Casimir phenomenon, the Casmir cell may also generate electric power via solar energy. In accordance with one or more embodiments, the Casimir cell may be exposed to light so as to increase the generated voltage. Further, in accordance with one or more embodiments, because of the light sensitivity of the Casimir cells, the Casimir cells may be configured to be used as light sensors.

Figure 9:
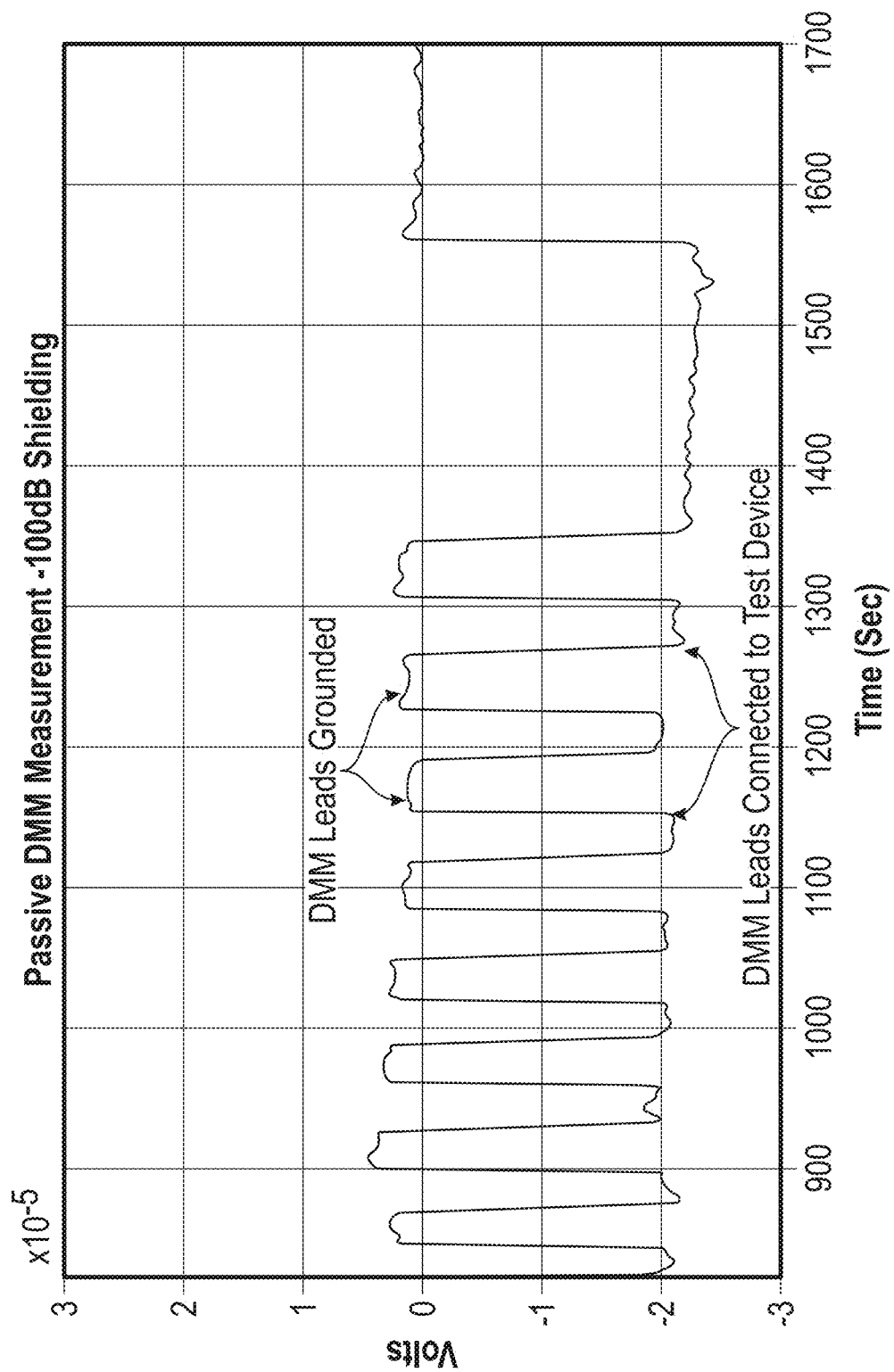
FIG. 9 shows a real-time voltage measurement of the array of Casimir cells shown in FIG. 7, using a Digital Display Multimeter, in accordance with one or more embodiments disclosed herein.

FIG. 9 shows a real-time voltage measurement of the prototype array of Casimir cells (702) shown in FIG. 7, using a Digital Display Multimeter (DDM), in accordance with one or more embodiments disclosed herein. Voltage sensitivity of the DDM is in microvolts. To eliminate environmental noise, the testing was conducted in an RF-shielded vault located on the NASA Johnson Space Center. FIG. 9 shows data collected from this test where the steps in the data indicate the difference between the detected voltage for when two probes of the DMM being connected to opposite contacts (704, 706) of the prototype array of Casimir cells (702) and when the DMM leads are grounded to one another. The shielded environment and test approach ensured that the voltage signal produced by the prototype array of Casimir cells (702) is the voltage generated by Casimir phenomenon in the Casimir cells.

The Casimir cell design can be combined in an assembly to replace existing batteries. For example, a CR2032 battery cell provides 3V voltage potential with current capability of ~10 mA. An equivalent battery that includes an array of the Casimir cells and can provide similar voltage potential and current can be a 1 centimeter (cm) by 1 cm wafer populated with an array of 200 by 200 Casimir cells. This wafer can be arranged such that there are 4000 Casimir cells in series in each group (e.g., in the form of a rail) with 10 groups being in parallel. To this end, the wafer may be shaved down to 30 micrometers thick and layered with another 24 identical wafer making for a 24 die stack assembly. This assembly may be used to replace the entire inner chemical contents of the CR2032 battery resulting in a Casimir CR2032 power battery that will no longer need to recharge. This same approach may be used for all other forms of batteries including, but not limited to, AA, AAA, D, C, 9V, or 4689 battery. Additionally, the power generating capability disclosed in one or more embodiments will introduce new approaches such as self-powered Integrated Circuit (IC) implementations, remote sensors, self-powered medical devices, smart packaging, smart clothing, or home power systems. This would allow for possibility to generate electricity in areas that do not have access to a power grid or traditional renewable energy sources.

Figure 10:
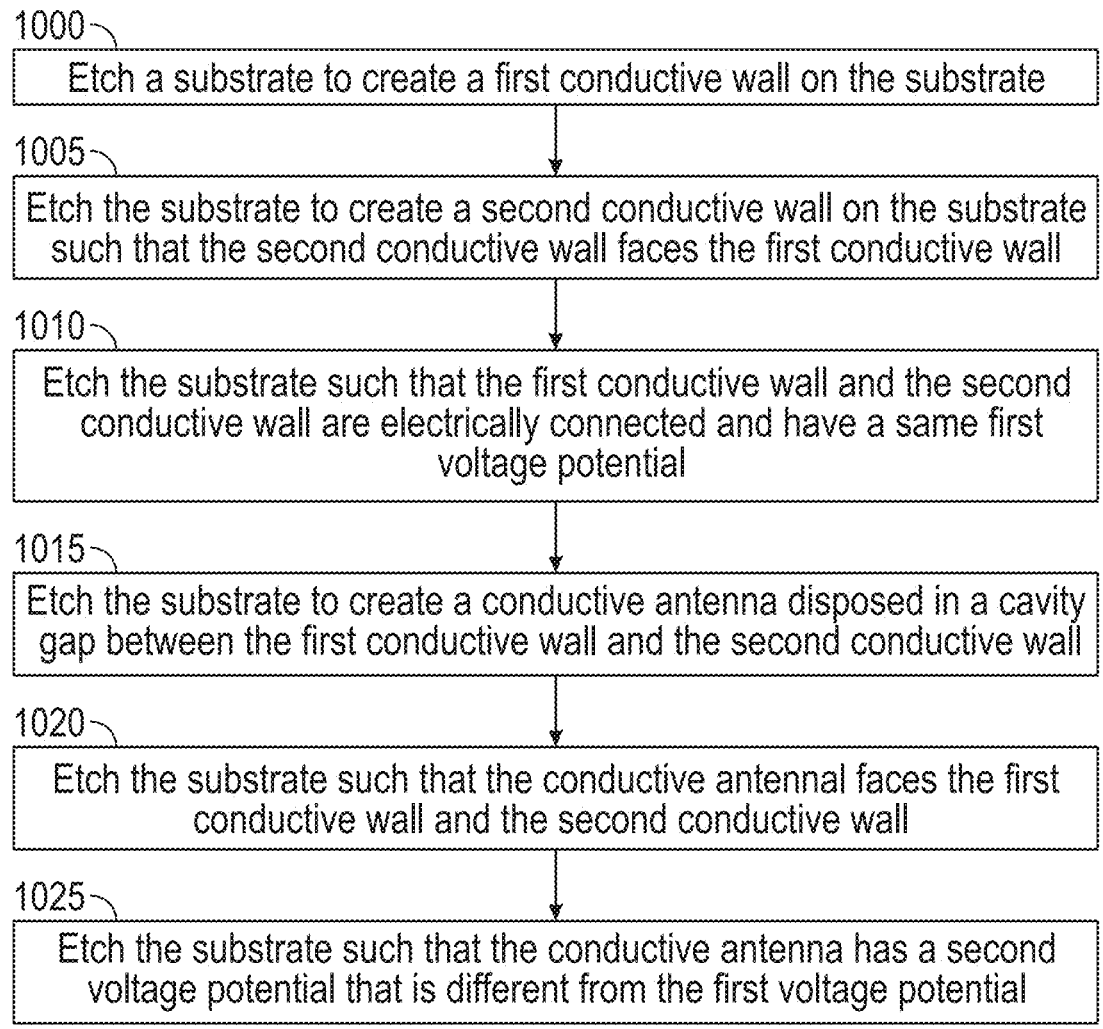
FIG. 10 shows a flow chart for fabricating a Casimir cell, in accordance with one or more embodiments disclosed herein.

FIG. 10 shows a flow chart for fabricating a Casimir cell, in accordance with one or more embodiments disclosed herein. In one or more embodiments, one or more of the steps shown in FIG. 10 may be omitted, repeated, and/or performed in a different order than the order shown in FIG. 10. Accordingly, the scope of the invention should not be considered limited to the specific arrangement of the steps shown in FIG. 10. The steps shown in FIG. 10 are explained below.

In Step 1000, a substrate is etched to create a first conductive wall on the substrate.

In Step 1005, the substrate is etched to create a second conductive wall on the substrate such that the second conductive wall faces the first conductive wall.

In Step 1010, the substrate is etched such that the first conductive wall and the second conductive wall are electrically connected and have a same first voltage potential.

In Step 1015, the substrate is etched to create a conductive antenna disposed in a cavity gap that is a space between the first conductive wall and the second conductive wall.

In Step 1020, the substrate is etched such that the conductive antenna faces the first conductive wall and the second conductive wall.

In Step 1025, the substrate is etched such that the conductive antenna has a second voltage potential that is different from the first voltage potential.

Examples of the above steps are described above, for example with reference to FIGS. 1-7.

In accordance with one or more embodiments, one or more of Step 1000 through Step 1025 may be performed at the same time. For example, the substrate may be etched to create the first conductive wall, the second conductive wall, and the conductive antenna at the same time or from the same material.

In accordance with one or more embodiments, the method described with reference to FIG. 10 for fabricating a Casimir cell may include the following steps. Initially, an SiO2 masked pattern may be disposed on a substrate to mask the leads heading to the conductive walls and heading to the conductive antenna. These leads will also serve as the foundation for the conductive walls and conductive antenna. Then, a photoresist pattern for the conductive walls and conductive antenna is disposed on top of the SiO2 mask, while ensuring proper alignment between the photoresist pattern and SiO2 mask. Then, etching operation(s) are performed to achieve desired height for the conductive walls and antenna, while maintaining the leads into and out of the Casimir cell. In one or more embodiments, this approach may be used to achieve an array of a×b Casimir cells in series and parallel arrangements as desired based on specific applications. Here, "a" is the number of rows in the array of Casimir cells and "b" is the number of columns in the array of Casimir cells.

Further, as described below in detail, the Casimir cell interacts with the asymmetry formed in the quantum vacuum field to generate power. The theory for the results and characteristics of the Casmir cell shown above are described below, in accordance with one or more embodiments.

Dynamic Vacuum Model Synopsis

The Copenhagen interpretation of the physical world at a microscopic level is that the nature of reality is probabilistic and not deterministic. While the Copenhagen interpretation may be considered the distinction of being the favored line of thinking, it is not without alternatives. One of the alternative lines of thinking in the ontological debate of the nature of reality at the microscopic level is a group of pilot wave theories. The pilot wave theories are a family of realist/deterministic interpretation of quantum mechanics that make the conjecture that the statistical nature of the formalism of quantum mechanics is due to an ignorance of an underlying more fundamental real dynamics, and that microscopic particles follow real trajectories over time just like larger classical bodies do. The first pilot wave theory was proposed by de Broglie in 1923 where he proposed that a particle can interact with an accompanying guiding wave field, or pilot wave, and this interaction is responsible for guiding the particle along its trajectory orthogonal to the surfaces of constant phase. Later in 1952, Bohm published a pilot wave theory where the guiding wave is equivalent to the solution of the Schrödinger equation and a particle's velocity is equivalent to the quantum velocity of probability. A more recent conjecture put forward in the literature considers the vacuum as a form of quantum fluid that can sustain both spatial and temporal variations, and therefore as a dynamic vacuum. In the dynamic vacuum model, the vacuum fluctuations play the role of the guiding wave, specifically the vacuum fluctuations (e.g., virtual fermions and virtual photons) serve as the dynamic medium that guides a real particle (e.g., unpaired vacuum fluctuation) on its way.

Recently, researchers showed a deep and explicit connection between the Schrödinger equation and the Quantum potential, and this discovery led to the detailed derivation of the acoustic wave equation for the quantum medium. Armed with the insight that this quantum medium may be viewed as a spatially and temporally varying quantum fluid, the researchers showed the development of a numerical model of the hydrogen atom. The model includes the assumptions of a quantum fluid surrounding the proton, a density distribution of the fluid, and a velocity field describing the spatially varying speed of propagation of disturbances in the density field. In this dynamic system, acoustic-like resonances could be established describing the electron orbitals as determined by the Helmholtz wave equation. It was shown by the numerical analysis that the acoustic eigenfrequencies of the system matched closely with observed hydrogen orbital energy states ($\psi_{100}$ error<1%). This is the explicit difference in this approach versus the standard approach of using the Schrödinger equation with the Copenhagen interpretation. This is a deterministic approach modeling of the vacuum as a fluid in which longitudinal waves can manifest. In contrast, in Copenhagen interpretation nothing is explicitly waving and the Schrödinger wave equation only describes probabilities.

For a medium to manifest an acoustic resonance, it must be capable of manifesting the longitudinal waves that comprise the acoustic resonance. As part of the process of understanding the implications of this, it is useful to consider the generally understood properties of an acoustic/longitudinal wave. In an acoustic wave expressed in air, water, or some other familiar dynamical medium, the unperturbed state of the medium is such that individual particles are arranged with some nominal spacing yielding an average number density of particles. In the presence of an acoustic wave disturbance, the particles are alternately compressed and rarefied about the unperturbed number density as the wave transits through the medium. In other words, the specks of mass of the medium are moved closer together and farther apart by the transit of the wave, as compared to their rest state. Applying the concept to the hydrogen atom case mentioned above, it is conjectured that the individual components of the medium are, to first order, ephemeral fermion-antifermion pairs appearing and disappearing in their individual bubbles of Heisenberg uncertainty, and that there is an average unperturbed separation of these bubbles. In addition to temporal variations imposed on the medium due to the acoustic wave, the number density is also spatially affected by the energy density associated with any fields expressed in the medium such as the proton's electrostatic potential. This view may be considered complementary to the Copenhagen interpretation in that the density and velocity fields play the role of hidden variables within the pilot wave interpretation. It should be noted that this view also provides a potential answer to the question, "What is waving?" at the heart of all quantum theories involving any form of wave equation. As such, in addition to being complimentary to the Copenhagen interpretation, this view can derive useful insights into the physical reality not obtained if one only considers the time-independent form of the Schrödinger equation. In other words, this view will make predictions beyond those of QFT.

Casimir Connection

At the macroscopic scale, the idea of the vacuum is intuitively simple/straightforward—empty space is empty and void of any matter/energy. However, at the quantum/microscopic scale the idea of the vacuum is more complicated owing to the mathematical nature of the Heisenberg uncertainty principle. At the microscopic scale, empty space is not empty—rather, it includes individual components that are, to the first order, ephemeral fermion-antifermion pairs appearing and disappearing within their individual bubbles of Heisenberg uncertainty.

The Casimir phenomenon is an observable consequence of the quantum vacuum. The textbook illustration of the Casimir phenomenon includes two parallel/conducting plates placed less than 1 micrometer apart forming a cavity. The presence of these closely spaced plates in the quantum vacuum restricts which vacuum fluctuation modes can be in the cavity. Integrating the energy density of these fluctuations over all possible wavelengths inside and outside the cavity predicts that there is a negative pressure inside the cavity resulting an attractive force, the Casimir phenomenon, that works to pull the plates together.

The dynamic vacuum model predicts that the negative vacuum energy density present in the cavity is not isotropic. Rather, there is a larger magnitude negative vacuum energy density concentrated along the cavity mid-plane that relaxes non-linearly to the unperturbed state at the cavity boundaries. It is speculated that the energy density structure in a Casimir cavity is coupled to a small electrostatic polarization field in the vacuum fluctuations.

Casimir Power Cell

The perturbed density field of the quantum vacuum state inside a Casimir cavity has $$\frac{1}{d^4}$$

dependency, where "d" is the width of the cavity gap. Similarly, the dynamic vacuum model of the hydrogen atom discussed above has a density field of the quantum fluid around the proton with $$\frac{1}{r^4}$$

dependency suggesting a possible connection with the Casimir phenomenon for a parallel plate (wall) cavity. One could derive the effective average energy density for a given electron orbital of hydrogen by taking the energy $E_n$ of a given electron orbital with primary quantum number n and average that energy across a spherical volume defined by the corresponding Bohr radius $r_n$ allowed for that state. Turning to the Casimir cavity scenario, it was then reasoned that an analogue could be envisioned where a hypothetical Casimir cavity could be envisioned with a cavity gap equal to the Bohr diameter of the aforementioned electron orbital state. Calculating the energy density of this Casimir analogue matches calculated electron-orbital average energy density.

The correlation between the density function for the quantum fluid around the nucleus of the atom and the Casimir cavity calculation motivates further considerations. One can envision that the density equation derived from the electric field can provide a prediction for the shape and structure of the electric field inside the Casimir cavity. Typically, the density of the quantum vacuum within a Casimir cavity is assumed to be isotropic and unchanging, the conductive walls are at the same potential (usually grounded in an experiment), and there is no anticipated electric field expressed in the Casimir cavity. However, the cavity has the capacity to manifest an electrostatic polarization field. In this scenario, the field originates at the midplane of the cavity and extends outward to the plates in an analogous manner to what is found around the nucleus of the atom in the form of the radial electric field. In one or more embodiments, the polarization field present in the Casimir cavity can be detected.

One direct approach may be to construct a Casimir cavity that includes an electric field probe located along the midplane of the cavity, in accordance with one or more embodiments. For example, a probe may be a single whip probe or a fork-like probe that has three or more whip probes (e.g., pillars) or may be a waffle grid. The constraint for the whip probes (or equivalent) would be that their cross section would be minimal when compared to the size of the cavity gap so that their effects on the vacuum energy density are negligible from an experimental view. In another words, one must ensure that the evanescent fields within the material structure that makes up the pillars do not decay to the unperturbed state such that the pillars in effect self-screen themselves from the very phenomenon they are being used to be detected. FIG. 1 shows a representation of the Casimir cavity concept.

The Casimir cavity shown in FIG. 1, when properly designed and connected to appropriately sensitive measurement equipment, is able to produce a DC voltage signal with sustained current capability. In another word, the Casimir cavity is able to produce power. Some critical design parameters to make the concept measurable in the lab and scalable to applications are the cavity gap, pillar size, conductive wall area, dielectric material used in cavity gap, and materials used for the conductive walls and pillars. As noted earlier, the perturbed density field in the cavity has $$\frac{1}{r^4}$$

dependency, and the useful operational cavity gap is expected to start at maximum of ~10 micrometers down to the nanometer level and further if manufacturing ability allows. The voltage magnitude of a singular Casimir cavity measured across the conductive walls and pillars is small, ranging from nanovolt to microvolt for cavities with gaps measured in the micrometer to nanometer range, respectively. The current capability for an individual Casimir cavity is a function of the area of the conductive walls and the cavity gap. The size of the conductive walls allows for a larger cross-sectional area that is then coupled to the tunneling current capability between the conductive walls and the pillars. All things being equal, larger conductive wall area increases the current capability of an individual cavity. Decreasing the cavity gap will increase the magnitude of the voltage field (bias voltage) present between the conductive walls and the pillars, thus increasing the tunneling current for the given cavity design.

A Casimir cavity manifests a perturbed (less-energetic) state of the quantum vacuum field in the region enclosed by the cavity walls. This means in principle that there are fewer vacuum fluctuations being manifested inside the cavity volume than there are in the surrounding region not encapsulated by the cavity walls. The evanescent fields of the perturbed vacuum state into the cavity walls also predict that the vacuum fluctuation density within the cavity walls is higher than the fluctuation density within the cavity. In addition, the density of vacuum fluctuations (e.g., virtual photons) that may occur within the cavity wall materials is higher than the density of vacuum fluctuations that may occur within the pillar materials that are located at the midplane of the cavity. Accordingly, there will be a disproportionate number of vacuum fluctuations that occur within the cavity walls and the pillars. This higher flux of vacuum fluctuations will, in effect, realize a larger number of electron holes in the Casimir cavity walls as compared to the pillars.

An electron is excited in the cavity wall by a vacuum fluctuation such that it tunnels across the cavity gap to the isolated pillars at the cavity midplane. The pillars are in a reduced flux of vacuum fluctuations and are statistically less likely to reverse or reciprocate the phenomenon. This generates a situation where there is an imbalance of electron holes and electrons across the structure. This resultant asymmetry of electron holes and electrons is the root of the manifestation of this electrostatic polarization field. When the cavity walls and the pillars of a Casimir cavity are connected by means of a conducting wire, the excess electrons in the pillar structure are then able to move back to the cavity walls eliminating the imbalance. This current flow capability coupled with the voltage potential allows this device to generate power by means of the "shine" of the quantum vacuum field.

A terrestrial analog to illustrate the asymmetry of the dynamic vacuum field that helps realize the asymmetry of electron holes and electrons may be to envision a small pacific atoll island that has a ring-like structure and encircles a protected lagoon that is very quiescent and peaceful while the ocean outside the atoll island by comparison is quite tumultuous. In a similar vein, the Casimir cavity walls realize a quiescent state of the quantum vacuum inside the cavity, a "vacuum lagoon." The pillars placed within the cavity midplane, or "lagoon," have considerably less wave energy by comparison than the bounding cavity walls representative of the encircling atoll island. The Casimir cavity disclosed in accordance with one or more embodiments works in effect by creating an asymmetry in how the structural elements perceive and interact with the effective "shine" of the quantum vacuum field.

An analogue can be drawn between the interaction of the Casimir cavity with the "shine" of the quantum vacuum field and the interaction of a common solar cell construction with a real photon field. In a common solar cell structure, there is an n-doped region sandwiched to a p-doped region. When a light source provides a flux of photons that interact with the depletion zone of the cell between the n-doped and p-doped regions, this photovoltaic process generates electron-hole pairs where the electrons migrate to the n-doped region and the electron holes migrate to the p-doped region. When the n-doped region is connected to the p-doped region by means of a conducting wire, excess electrons in the n-doped region flow through the wire to the p-doped region and eliminate the imbalance. In the Casimir cavity, the Casimir cavity's physical construction allows for an asymmetry in the structure's interaction with the "shine" of the quantum vacuum field. And this asymmetry can generate power.

Worldline Numerics

Figure 11:
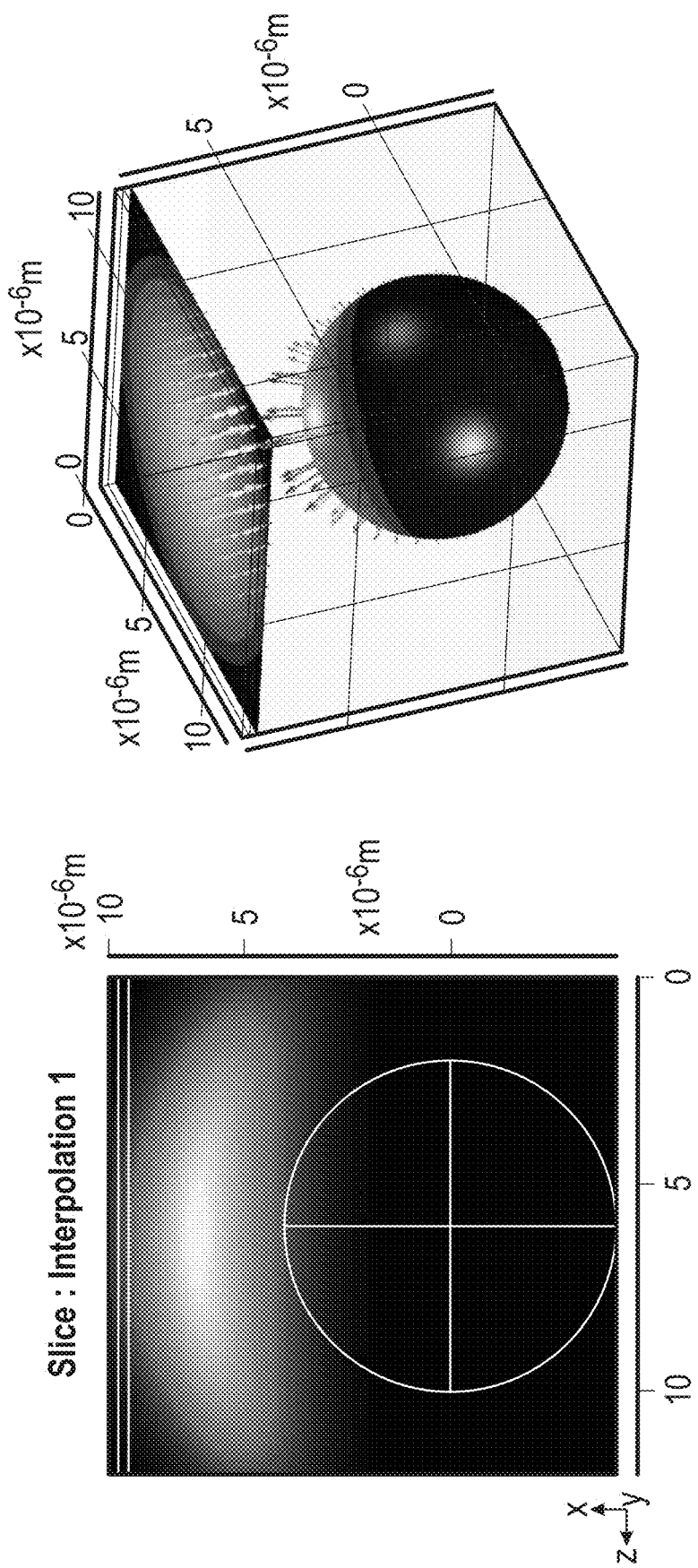
FIG. 11 shows a simulation plot, in accordance with one or more embodiments disclosed herein.

The numerical methods approach used to model and quantify the vacuum response to the cavity structure is known as worldline numerics. This technique provides a high-fidelity prediction of the perturbed vacuum state inside a model geometry (e.g., the evanescent fields in a structure) along with predictions for the perturbed vacuum state within the cavity gap. An additional benefit of the worldline numerics method for studying the Casimir effect is that it can be used to address any type of geometry with effectively no restrictions on curvature or lack of smoothness. Due to the similarities with the dynamic vacuum model and its computational flexibility coupled with maturity, the worldline numerics technique has been implemented to consider Casimir cavities and determine the negative vacuum energy density distribution in the cavities and within the pillars. FIG. 11 depicts the numerical analysis results from an implementation of the worldline approach considering a three-dimensional sphere with a radius of 4 micrometers separated from an infinite flat plate with a separation of 4 micrometers. The approach was implemented using Open MPI-enabled c-code and the analysis was run on one hundred 2.40 GHz Intel Skylake CPUs. The model grid was a 50×50×50 grid with a 2000 unit-loop ensemble. The left panel shows a two-dimensional section cut of the predicted distribution to the negative vacuum energy density between the two bodies where it should also be noted that the field gradients extend into both the body of the sphere and the flat plate in the form of evanescent fields. The right panel shows the distribution of forces across the surfaces of the model and was generated using COMSOL. The following section provides a summary of the details behind the worldline numerics analytic approach.

Synopsis of Casimir Worldline Numerics Method

The string theory inspired worldline numerics approach to determine the Casimir effect, and the critical aspects of the analysis technique are briefly summarized here for convenience. With the objective of evaluating the Casimir inter- action energy $E_{Casimir}$ (e.g. normalized) arising from the coupling of a real scalar quantum field $\phi$ of finite mass m with a background potential $V(x)$ that represents the Casimir geometry, the key equation is Eq. 1:

$$\Gamma[V] = -\frac{1}{2(4\pi)^2} \int_{1/\Lambda^2}^{\infty} \frac{dT}{T^3} e^{-m^2 T} \int d^4x [\langle W_V[y(t); x]\rangle_y - 1]. \quad \text{Eq. 1}$$

The expectation value in Eq. 2 is the average of the loop ensemble over all closed loops with Gaussian walks:

$$\langle W_V[y(t); x]\rangle_y = \frac{\int_{y(0)=y(1)} \mathcal{D}y W_V[y(t); x] e^{-\int_0^1 d t \dot{y}^2/4}}{\int_{y(0)=y(1)} \mathcal{D}y e^{-\int_0^1 d t \dot{y}^2/4}}, \quad \text{Eq. 2}$$

where the following "Wilson loop" identity has been introduced with y representing the (unit) loop path, x representing the position shift of the unit loop in model space, and T denoting the proper time and serves to scale the unit loops:

$$W_V[y(t); x] = \exp\left[-T \int_0^1 dt V(x + \sqrt{T} y(t))\right]. \quad \text{Eq. 3}$$

Equipped with this information, one can calculate the (unrenormalized) Casimir energy as $\epsilon = \Gamma/\int dx_0$ where the integral represents the "volume" in the time direction. When considering the Casimir phenomenon, the portion of the Casimir energy that has a dependency on the relative positions of the bounding geometries can be obtained by subtracting the energies of the single objects from the total Casimir energy:

$$E_{Casimir} := E_{V_1 + V_2 + \ldots} - E_{V_1} - E_{V_2} - \ldots . \quad \text{Eq. 4}$$

The Casimir phenomenon can be obtained by taking the negative spatial derivative of this interaction energy, and further, this process has removed any UV divergences. In the Dirichlet limit $\lambda \to \infty$ and for a massless scalar field with Dirichlet boundaries in D=3+1, the worldline representation of the Casimir interaction energy boils down to:

$$E_{Casimir} = -\frac{1}{2(4\pi)^2} \int_0^{\infty} \frac{dT}{T^3} \int d^3 x_{CM} \langle \Theta_\Sigma[x(\tau)]\rangle_x. \quad \text{Eq. 5}$$

The worldline functional $\Theta_\Sigma[x(\tau)] = 0$ if the re-scaled unit loop does not intersect any Casimir geometry and $\Theta_\Sigma[x(\tau)] = 1-n$ if the re-scaled loop intersects $n \geq 1$ Casimir geometry. The numerical evaluation process requires two discretization steps. The first is the discretization of the path integral into an ensemble of $n_L$ random paths $x(\tau)$, $\ell = 1, \ldots, n_L$ with each path forming a closed spacetime loop. The second is the discretization of the proper time interval $\tau \in [0, T]$ into N steps such that an individual closed loop consists of N points per loop: $\mathbf{x}_{\ell k} := \mathbf{x}_\ell(k \cdot T/N), k=1, \ldots N$. Transporting and rescaling the ensemble of unit loops to a point $x_{CM}$ in the model takes the following form: $\mathbf{x}_{\ell k} = x_{CM} + \sqrt{T} \mathbf{y}_{\ell k}$. Applying these two discretizations to the Casimir interaction energy in Eq. 5 yields the following form:

$$E_{Casimir} = -\frac{1}{2(4\pi)^2} \int_0^\infty \frac{dT}{T^3} \int d^3x_{CM} \frac{1}{n_L} \sum_{\ell=1}^{n_L} \Theta_\Sigma[x_{CM} + \sqrt{T} y_\ell]. \quad \text{Eq. 6}$$

As the worldline numeric approach for the Casimir phenomenon is based on (massless) scalar fields, the technique may currently only assess idealized behavior for bounding geometry and cannot assess any frequency dependence of materials. Additionally, the approach does not account for the impacts of temperature. However, it is still a very capable and appealing technique in that it can provide quick and fairly accurate assessments for very complicated geometries where analytic techniques are not practical.

Generating Unit Loops and Computational Approach

Figure 12:
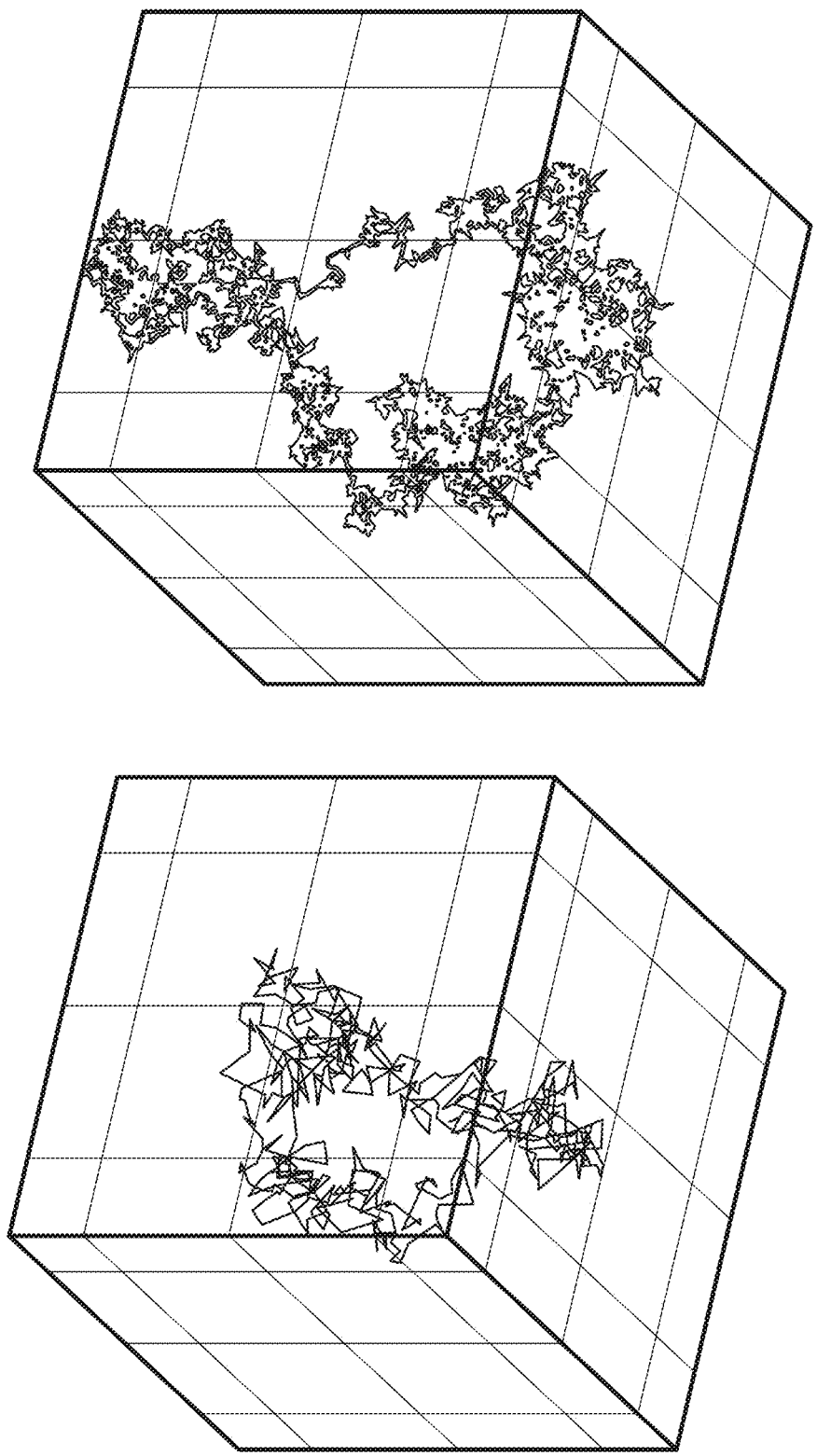
FIG. 12 shows a simulation plot, in accordance with one or more embodiments disclosed herein.

The developers of the worldline numerics for the Casimir phenomenon have explored numerous ways to generate ensembles of unit loops with Gaussian distribution ranging from a heat bath kernel to random walks, and finally landing on a technique denoted as the "v-loop" algorithm. The "v-loop" technique was selected as it can computationally generate an ensemble of $n_L$ each having N points per loop without having to perform multiple iterations on each loop to realize a closed random walk/worldline with the required statistical characteristics. FIG. 12 shows examples of Gaussian distributed closed unit-loops generated by the v-loop methodology. The algorithm will generate ensemble of $n_L$ unit loops to be scaled and applied at each geometric point of interest in a physical model. The left side of FIG. 12 is 500-point unit loop and the right side of FIG. 12 is 5000-point unit loop. A summary of the computational procedure steps are provided herein to facilitate understanding of the "v-loop" approach:

1. generate N−1 numbers $w_i$, (i=1, . . . , N−1) with a Gaussian distribution $e^{-w_i^2}$ (e.g. using Box-Müller method);
2. calculate N−1 numbers $\bar{v}_i$ by normalizing $w_i$:

$$\bar{v}_1 = \sqrt{\frac{2}{N}} w_1, \quad \text{Eq. 7}$$

$$\bar{v}_i = \frac{2}{\sqrt{N}} \sqrt{\frac{N+1-i}{N+2-i}} w_i, i = 2, \ldots, N-1;$$

3. calculate $v_i$ for i=2, . . . , N−1 with the following:

$$v_i = \bar{v}_i - \frac{1}{N+2-i} v_{i-1,1}, \quad \text{Eq. 8}$$

where $v_{i-1,1} = \sum_{j=2}^{i-1} v_j;$ 4. a unit loop y can now be created by using:

$$y_1 = \frac{1}{N}\left(\bar{v}_1 - \sum_{i=2}^{N-1}\left(N - i + \frac{1}{2}\right)v_i\right), \quad \text{Eq. 9}$$

$$y_i = y_{i-1} + v_i, i = 2, \ldots, N-1,$$

$$y_N = -\sum_{i=1}^{N-1} y_i; \text{ and}$$

5. this procedure is repeated $n_L$ times to create the unit loop ensemble $\mathbf{y}_\ell$ y with $\ell=1, \ldots, n_L$.

Figure 13A:
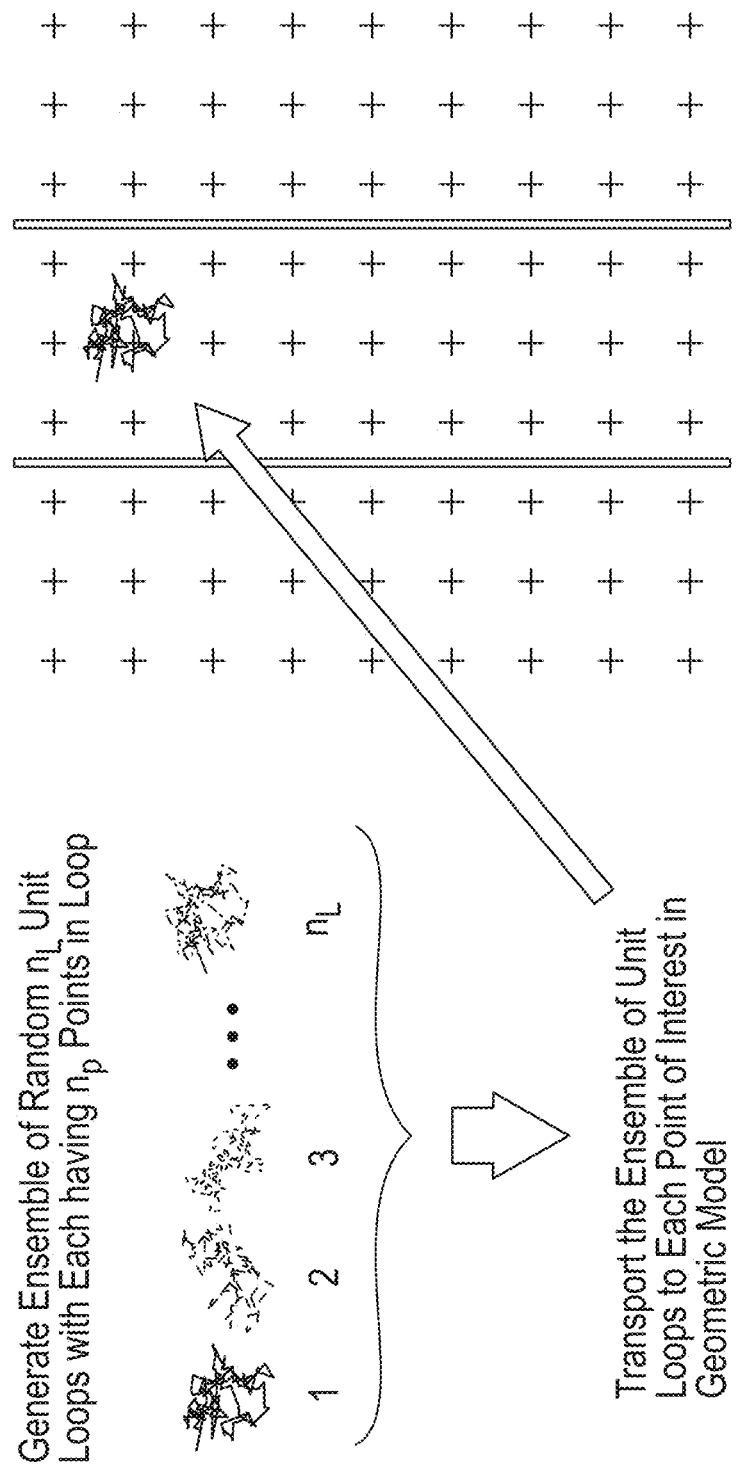
FIGS. 13A and 13B show modeling diagrams, in accordance with one or more embodiments.
Figure 13B:
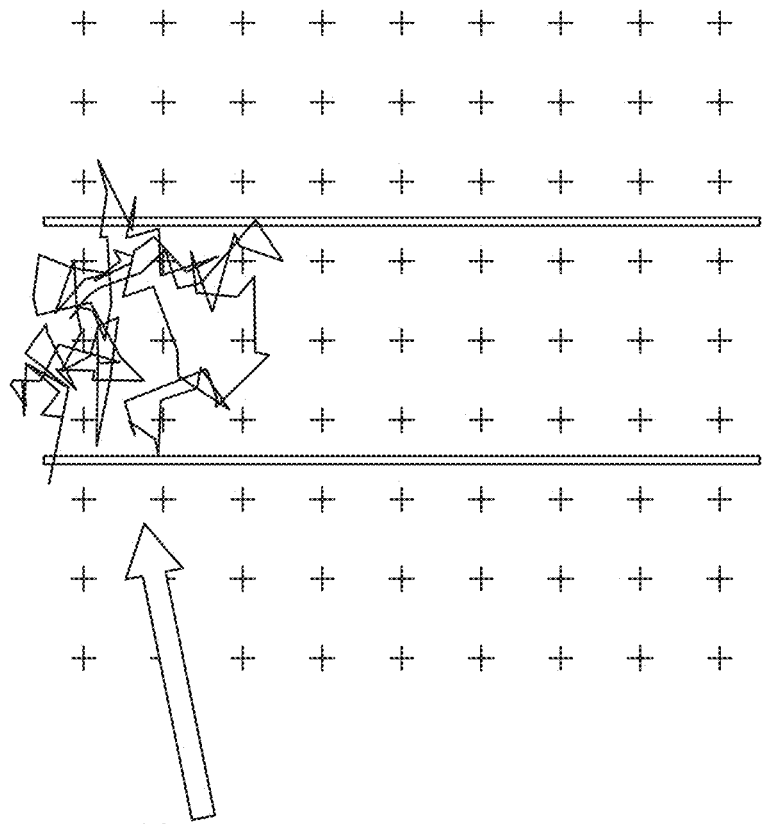

This numeric worldline approach may be used to address any type of geometry while other approaches such as Proximity-Force Approximation (PFA) are not as flexible. Additionally, the numeric worldline approach has no dependency on the choice of model grid spacing or grid choice. The answer for a single point of interest in space does not have any interdependency on any other model grid points and may be calculated in total isolation, if that is all that is needed. FIGS. 13A and 13B provide a pictorial representation of the analysis process for a parallel plate Casimir cavity. Specifically, FIG. 13A shows the unit loop ensemble being moved to a geometric point of interest in the model. FIG. 13B shows scaling of one of the unit loops from the ensemble to the point that it intersects 2+ bodies of the model. This establishes the support $\mathcal{S}_\ell$ to be used in integration and determining the weighted contribution of the loop to the Casimir energy density of the vacuum at this point in the model.

While FIGS. 13A and 13B depict a regularized model grid for communication purposes, the computational result at an individual model point is not dependent on adjacent points making the technique independent of grid choice. As indicated in FIGS. 13A and 13B, once the loop ensemble has been generated, the computational process to calculate the Casimir interaction energy follows the below enumerated steps:

1. The loop ensemble is moved to each model grid point of interest and scaled using proper time until 2+ bodies in the model are pierced;
2. The scale at which an individual loop pierces 2+ bodies defines the integral limits for the Casimir interaction energy integral;
3. The energy at the geometric point of interest in the model is increased based on wavelength (loop scale) and loop weight factor;
4. This scaling process is repeated for each loop in the ensemble at a geometric point of interest in the model; and
5. The above steps are repeated for each geometric point of interest in the model.

Validation of the implementation of the numeric worldline approach was done on a plate-plate case and a corresponding plate-sphere case and was compared to documented results in the literature. In the validation effort, it is confirmed that the model predicts the correct Casimir phenomenon for a given plate-plate or sphere place scenario.

This worldline numerics approach described is used to analyze a given custom Casimir cavity design to arrive at a predicted vacuum energy density distribution. This vacuum energy density is equated to an electric field magnitude, and COMSOL software (or equivalent) is used to convert this electric field into a charge density using the standard differential form of Gauss' Law $\vec{\nabla} \cdot \vec{E} = \rho/\varepsilon_0$. This charge density distribution is then used to calculate an electrostatic potential which provides the anticipated voltage potential of the device design.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A battery that comprises a Casimir-effect powered cell (Casimir cell), the Casimir cell comprising:
   a first conductive wall;

a second conductive wall that faces the first conductive wall; and a conductive antenna disposed in a cavity gap that is a space between the first conductive wall and the second conductive wall, wherein the conductive antenna faces the first conductive wall and the second conductive wall, wherein the first conductive wall and the second conductive wall produce a same first voltage potential, wherein the conductive antenna produces a second voltage potential that is different from the first voltage potential, and wherein a voltage that is the difference between the first voltage potential and the second voltage potential is generated by Casimir phenomenon based on arrangement of the conductive antenna between the first conductive wall and the second conductive wall.

2. The battery of claim 1, wherein the conductive antenna comprises a flat block, and the flat block is at least semi-transparent in at least a region of optical frequencies.

3. The battery of claim 1,
wherein the conductive antenna comprises a plurality of antenna elements that are electrically connected to one another and have the second voltage potential, and
wherein one or more of the plurality of antenna elements are pillars.

4. The battery of claim 1, wherein, from a cross-sectional view of the Casimir cell perpendicular to a plane of substrate on which the Casimir cell is disposed, one or more of the plurality of antenna elements have a round, rectangular, or prismatic shape.

5. The battery of claim 1, wherein the first conductive wall comprises a material selected from the group consisting of gold (Au), silver (Ag), platinum (Pt), aluminum (Al), copper (Cu), palladium (Pd), iridium (Ir), titanium nitride (TiN), molybdenum (Mo), silicon (Si), and graphene.

6. The battery of claim 1, wherein the first conductive wall comprises a doped semiconductor of a first polarity, and the conductive antenna comprises a doped semiconductor of a second polarity that is opposite of the first polarity.

7. The battery of claim 1, wherein an intervening space between the first conductive wall and the conductive antenna comprises a material selected from a group consisting of a gas dielectric, a liquid dielectric, and a solid dielectric.

8. The battery of claim 1, wherein an intervening space between the first conductive wall and the conductive antenna is a solid dielectric that is selected from a group consisting of silicon dioxide ($SiO_2$), aluminum oxide ($Al_2O_3$), tantalum pentoxide ($Ta_2O_5$), cerium oxide ($CeO_2$), hafnium oxide ($HfO_2$), Niobium pentoxide ($Nb_2O_5$), Niobium dioxide ($NbO_2$), titanium dioxide ($TiO_2$), titanium oxide (TiO or $Ti_3O_5$), Yttrium oxide ($Y_2O_3$), zirconium dioxide ($ZrO_2$), and zirconium oxide (ZrO).

9. The battery of claim 1, wherein the cavity gap has a width of not more than 10 micrometers.

10. The battery of claim 1, wherein a width of the conductive antenna along a width of the cavity gap is not less than half of the width of the cavity gap.

11. The battery of claim 1, wherein a first distance between the conductive antenna and the first conductive wall is the same as a second distance between the conductive antenna and the second conductive wall.

12. The battery of claim 1, wherein the first conductive wall, the second conductive wall, and the conductive antenna contain the same material.

13. The battery of claim 1, wherein the first conductive wall, the second conductive wall, and the conductive antenna are disposed vertically with respect to a substrate on which the Casimir cell is disposed.

14. The battery of claim 1,
wherein the battery comprises an array of Casimir cells,
wherein the array of Casimir cells is grouped into a plurality of groups of Casimir cells, each group comprising a plurality of Casimir cells,
wherein the groups of Casimir cells are connected in parallel to one another, and
wherein the plurality of Casimir cells within each group are connected in series to one another.

15. The battery of claim 1,
wherein the battery comprises an array of Casimir cells,
wherein the array of Casimir cells is grouped into a plurality of groups of Casimir cells, each group comprising a plurality of Casimir cells,
wherein the groups of Casimir cells are connected in series to one another, and
wherein the plurality of Casimir cells within each group are connected in parallel to one another.

16. The battery of claim 1, wherein the first conductive wall, the second conductive wall, and the conductive antenna are disposed horizontally with respect to a substrate on which the Casimir cell is disposed.

17. The battery of claim 16, wherein the conductive antenna is a grid.

18. The battery of claim 1,
wherein the Casimir cell comprises a c-shape wall that comprises the first conductive wall and the second conductive wall,
wherein the first conductive wall and the second conductive wall are opposite walls of the c-shape wall, and
wherein the conductive antenna is disposed inside the c-shape wall in between the first conductive wall and the second conductive wall.

19. The battery of claim 1, wherein the Casimir cell is exposed to light.

20. A method for making a Casimir-effect powered cell comprising:
etching a substrate to create a first conductive wall on the substrate;
etching the substrate to create a second conductive wall on the substrate such that the second conductive wall faces the first conductive wall; and
etching the substrate to create a conductive antenna disposed in a cavity gap that is a space between the first conductive wall and the second conductive wall,
wherein the conductive antenna faces the first conductive wall and the second conductive wall,
wherein the first conductive wall and the second conductive wall are etched to be electrically connected and have a same first voltage potential, and
wherein the conductive antenna is etched to have a second voltage potential that is different from the first potential.

* * * * *